United States Patent [19]
Okamoto et al.

[11] Patent Number: 5,710,066
[45] Date of Patent: Jan. 20, 1998

[54] METHOD OF FORMING FINE PATTERNS

[75] Inventors: Chikayuki Okamoto; Tadashi Nishioka; Satoru Kawazu, all of Hyogo, Japan

[73] Assignees: Mitsubishi Denki Kabushiki Kaisha, Tokyo; Ryoden Semiconductor System Engineering Corporation, Hyogo, both of Japan

[21] Appl. No.: 726,223

[22] Filed: Oct. 4, 1996

Related U.S. Application Data

[62] Division of Ser. No. 395,025, Feb. 27, 1995, Pat. No. 5,595,941.

[30] Foreign Application Priority Data

Jun. 1, 1994 [JP] Japan ..................... 6-120054

[51] Int. Cl.$^6$ ................................. H01L 21/302
[52] U.S. Cl. .................... 437/228; 156/661.11; 216/46; 216/47
[58] Field of Search ............ 156/659.11, 661.11; 216/46, 47, 48; 437/228

[56] References Cited

U.S. PATENT DOCUMENTS

| | | | |
|---|---|---|---|
| 4,502,914 | 3/1985 | Trumpp et al. | 437/228 |
| 4,648,937 | 3/1987 | Ogura et al. | 156/643.1 |
| 4,803,181 | 2/1989 | Buchmann et al. | 437/228 |
| 4,838,991 | 6/1989 | Cote | 216/46 |
| 4,871,630 | 10/1989 | Giammarco et al. | 216/46 |
| 5,023,203 | 6/1991 | Choi | 437/228 |
| 5,296,410 | 3/1994 | Yang | 437/228 |
| 5,328,810 | 7/1994 | Lowrey et al. | 430/313 |
| 5,342,481 | 8/1994 | Kadomura | 216/46 |

FOREIGN PATENT DOCUMENTS

| | | |
|---|---|---|
| 32 42 113 A1 | 11/1982 | Germany. |
| 63-054728 | 3/1988 | Japan. |
| 63-258020 | 10/1988 | Japan. |
| 1-035916 | 2/1989 | Japan. |
| 1-035917 | 2/1989 | Japan. |
| 2-5522 | 1/1990 | Japan. |
| 4096327 | 3/1992 | Japan. |
| 4-067624 | 3/1992 | Japan. |
| 5144782 | 6/1993 | Japan. |

OTHER PUBLICATIONS

"VLSI Fabrication Principles—Silicon And Gallium Arsenide"; Sorab K. Ghandi; John Wiley & Sons; N.Y., N.Y; ©1983; pp. 422–424.

"Applications of Plasma Proceses to VLSI Technology," Sugano, John Wiley and Sons, pp. 4–9.

"Semiconductor Devices Physics and Technology," S.M. SzE, John Wiley and Sons, pp. 436–442.

*Primary Examiner*—R. Bruce Breneman
*Assistant Examiner*—George Goudreau
*Attorney, Agent, or Firm*—Lowe, Price, LeBlanc & Becker

[57] ABSTRACT

Sidewalls of patterned resist are reformed using a reforming agent selected from the group consisting of (a) a carbon trichloride radical, (b) a mixture of silicon ion and oxygen ion, (c) a mixture of carbon ion and carbon monoxide ion, (d) a chlorine radical, (e) aluminum trichloride liquid and (f) dibutyl magnesium liquid, and sidewall reformed portions are thus formed on the sidewalls of pattern resist. The not reformed portion of the patterned resist is removed away, and sidewall reformed portions are left on an object layer. The portion of object layer excluding the portion immediately below sidewall reformed portions is etched away, and fine patterns of object layer are formed as a result.

9 Claims, 22 Drawing Sheets

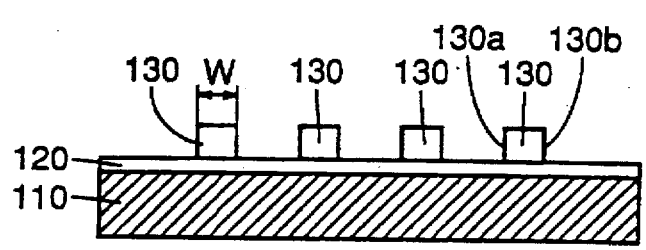
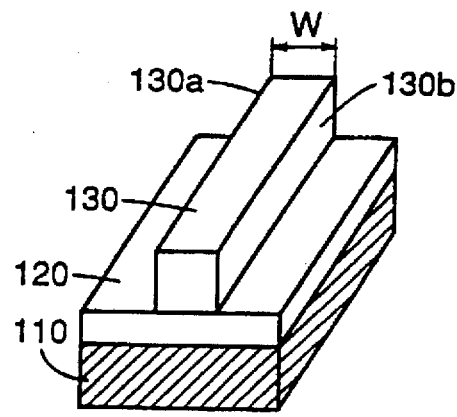
FIG.1    FIG.1A
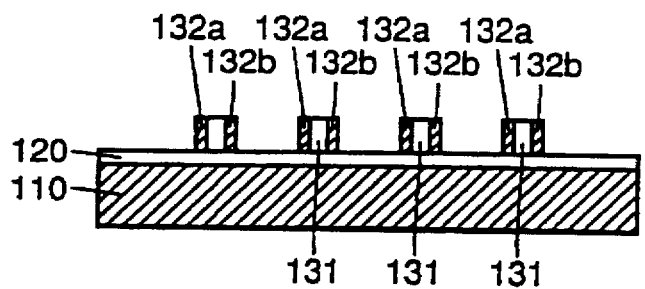
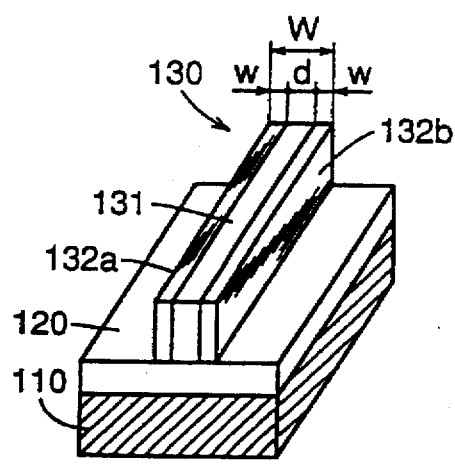
FIG.2    FIG.2A

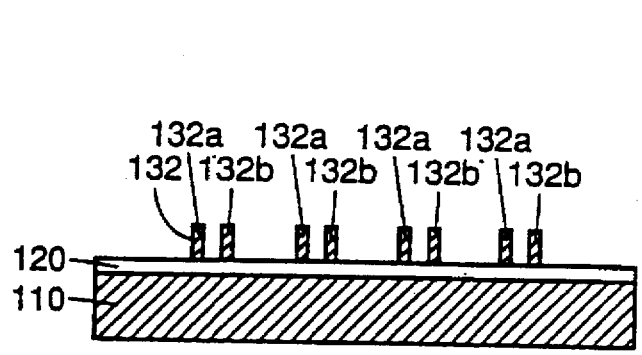
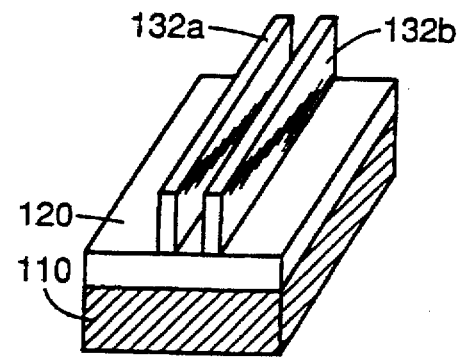
FIG.3   FIG.3A
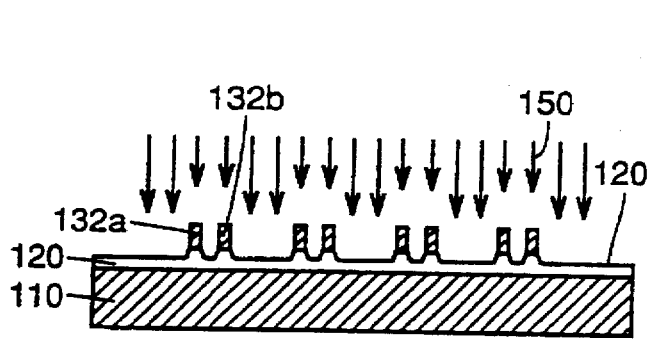
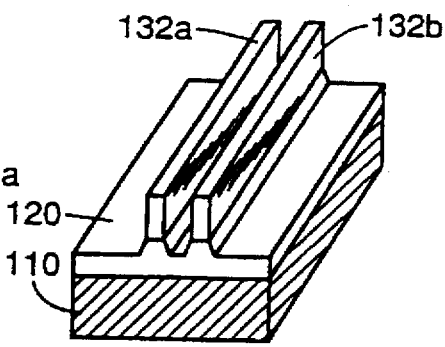
FIG.4   FIG.4A
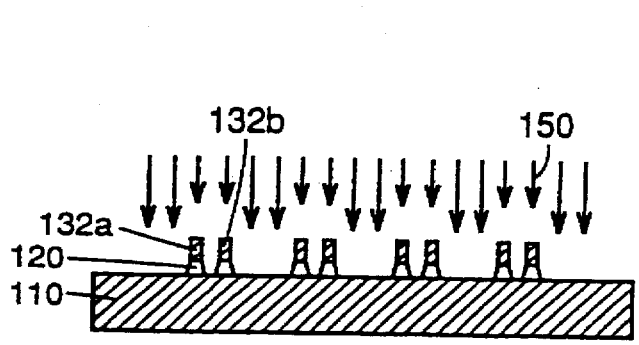
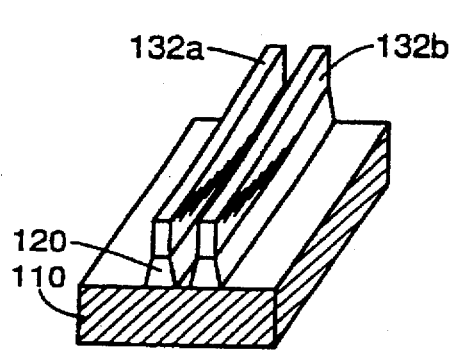
FIG.5   FIG.5A

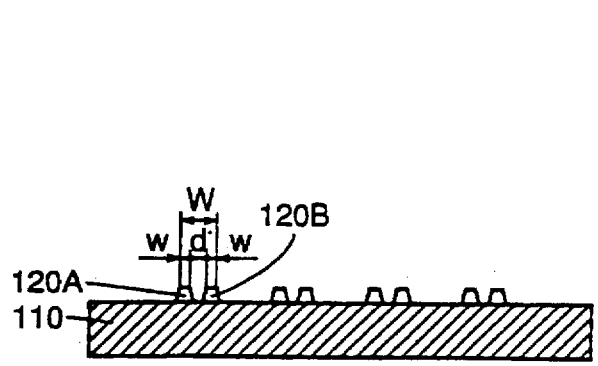
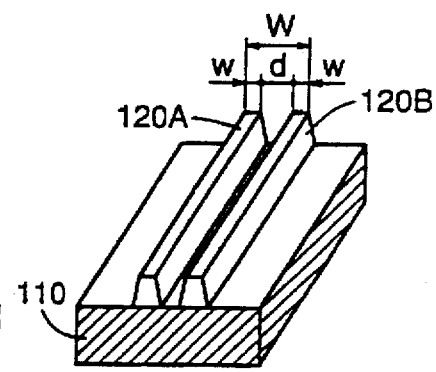
FIG.6     FIG.6A
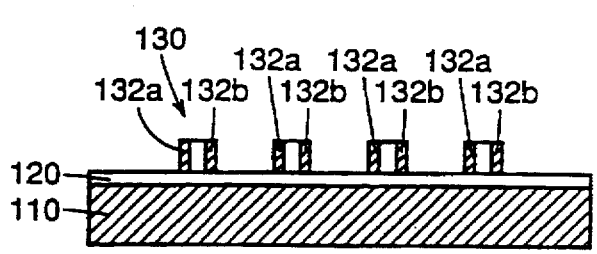
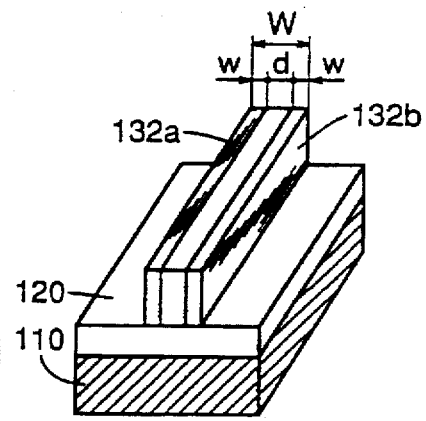
FIG.7     FIG.7A
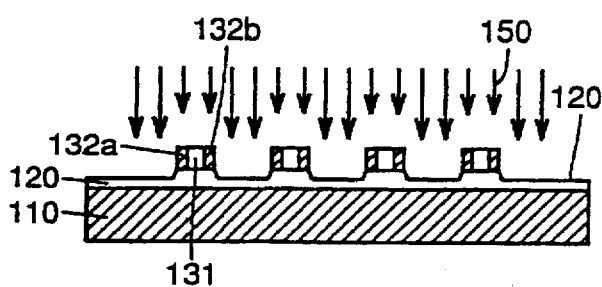
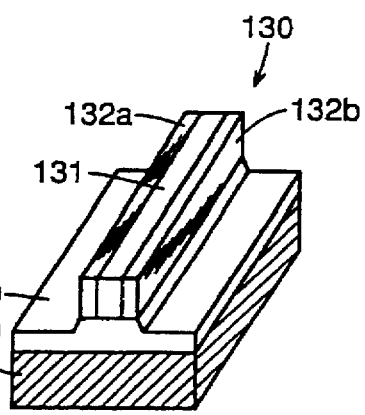
FIG.8     FIG.8A

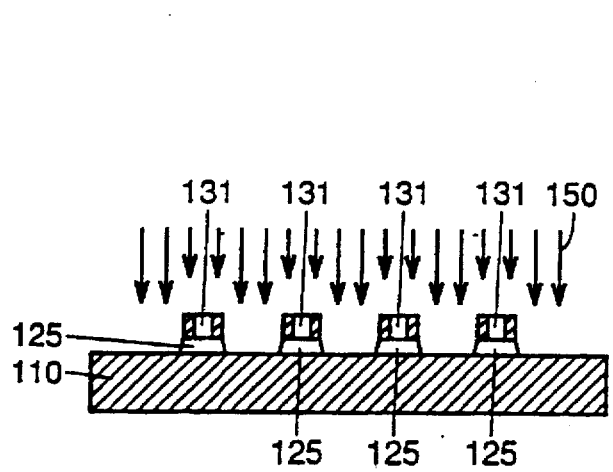
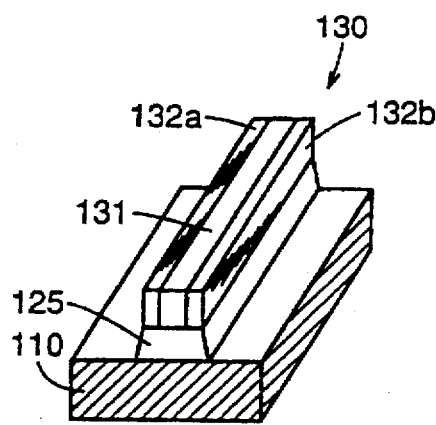
FIG.9    FIG.9A
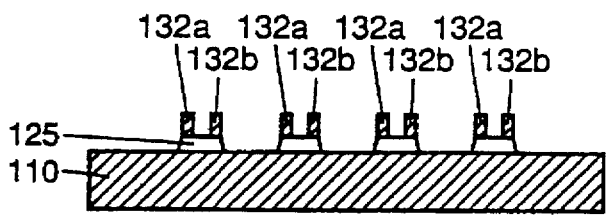
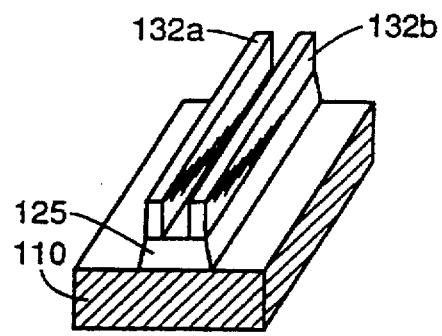
FIG.10    FIG.10A
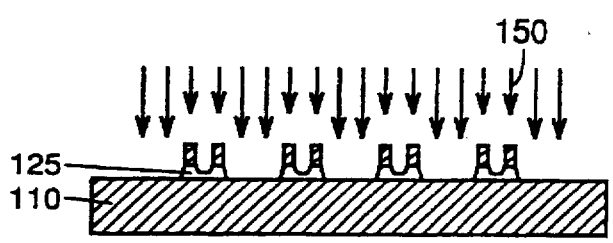
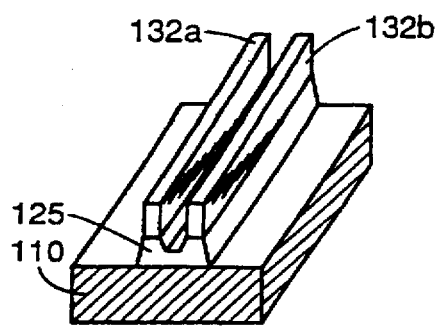
FIG.11    FIG.11A

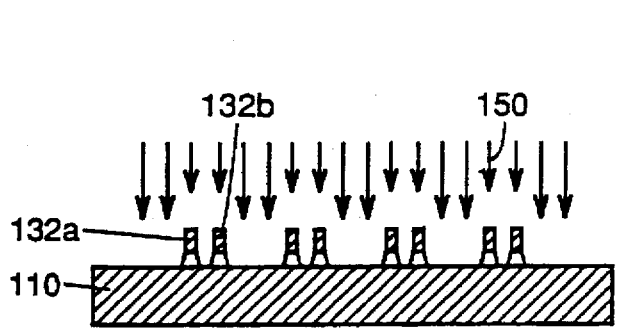
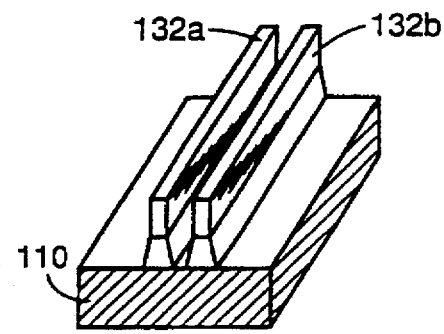
FIG.12　　　　　FIG.12A
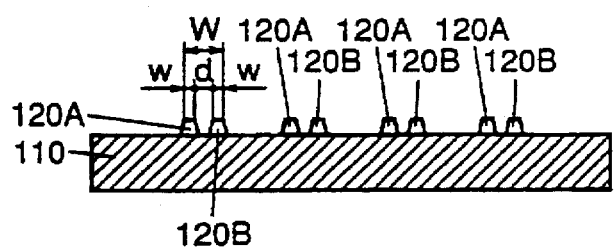
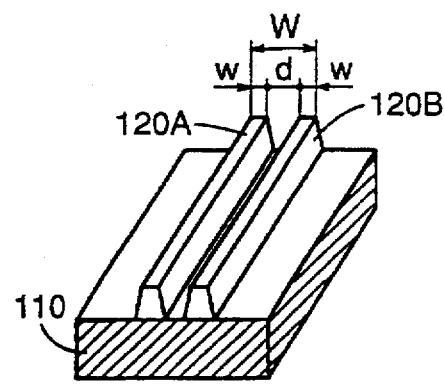
FIG.13　　　　　FIG.13A
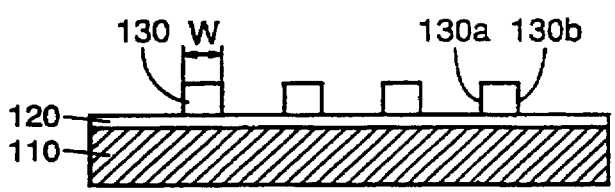
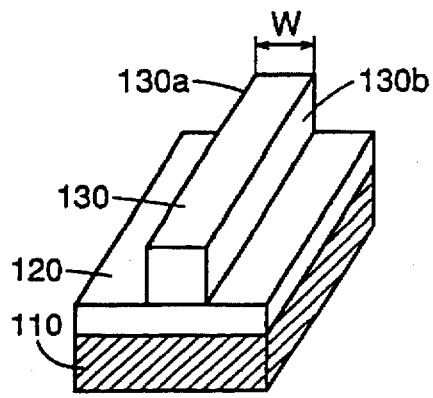
FIG.14　　　　　FIG.14A

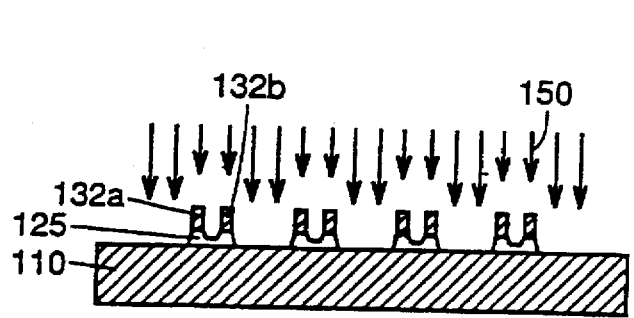
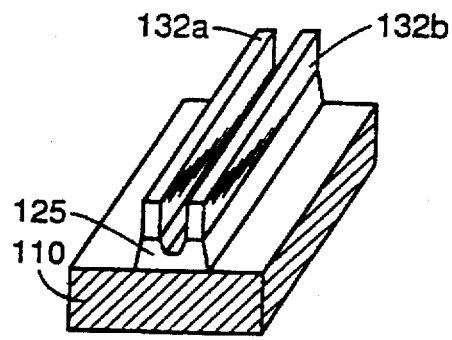
FIG.18
FIG.18A
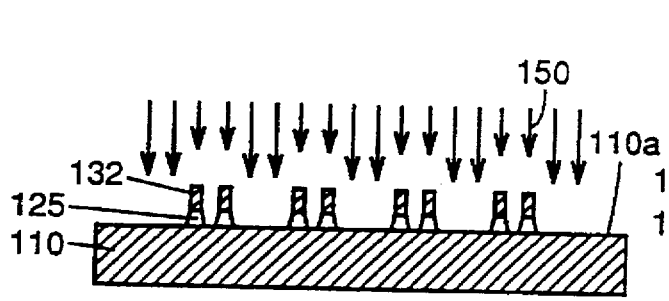
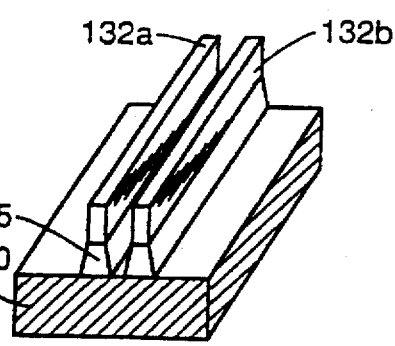
FIG.19
FIG.19A
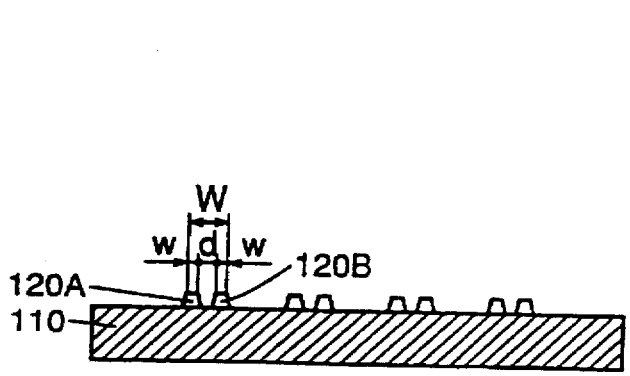
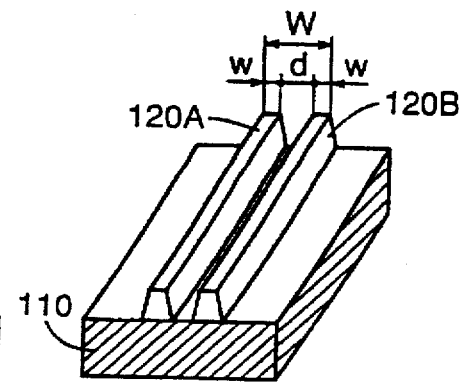
FIG.20
FIG.20A

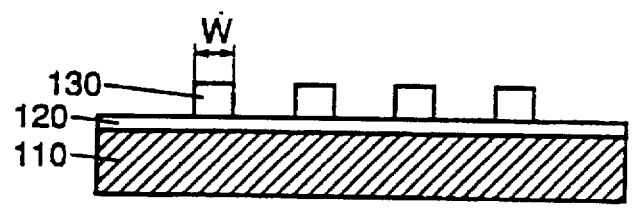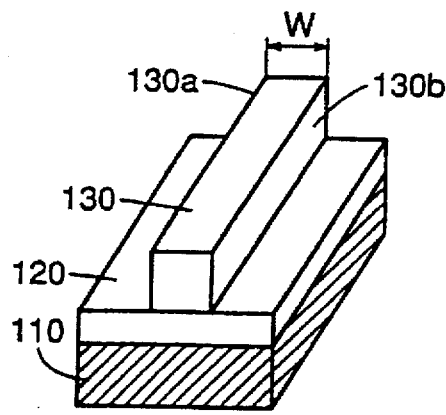
FIG.21      FIG.21A
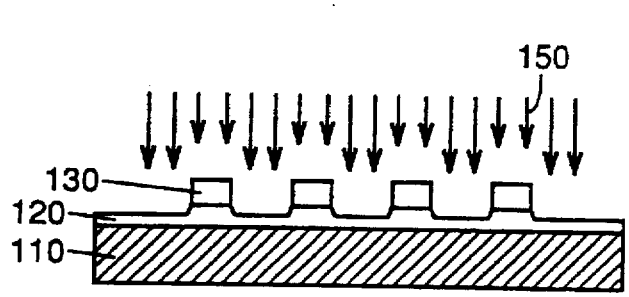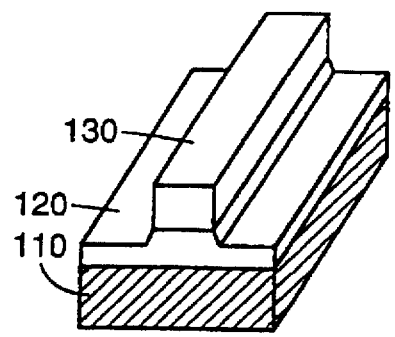
FIG.22      FIG.22A
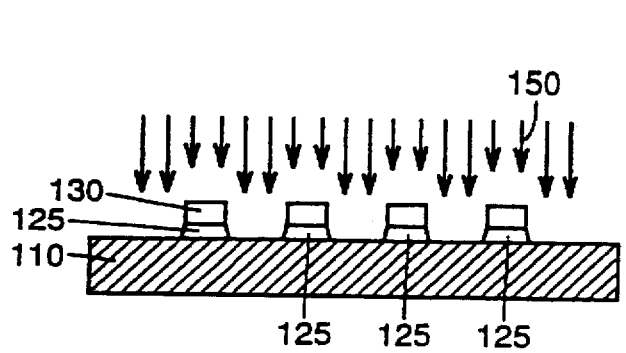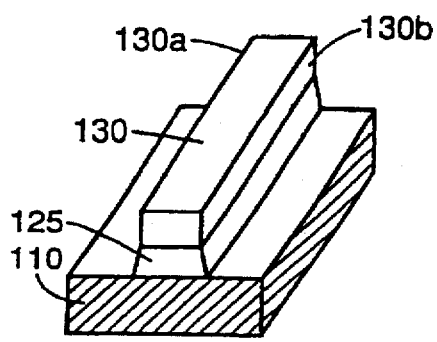
FIG.23      FIG.23A

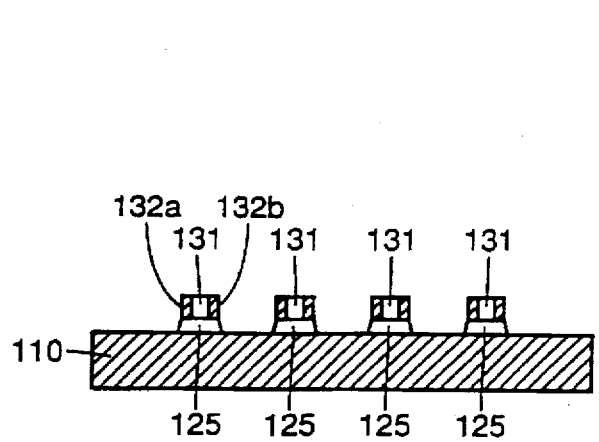
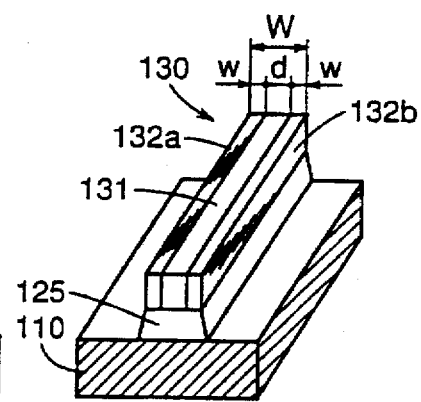
FIG.24   FIG.24A
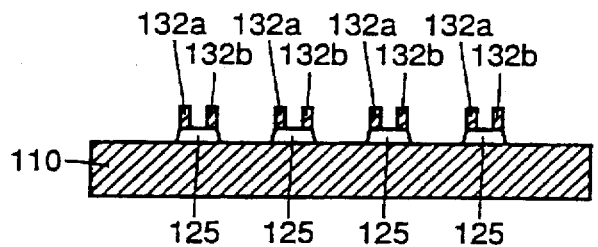
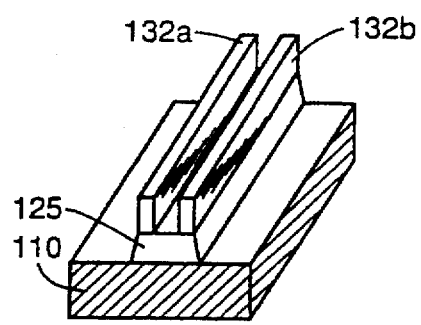
FIG.25   FIG.25A
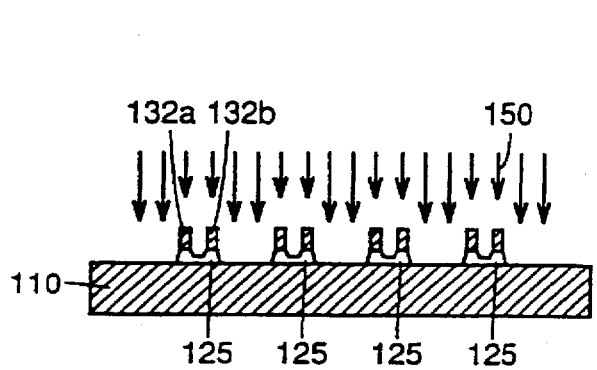
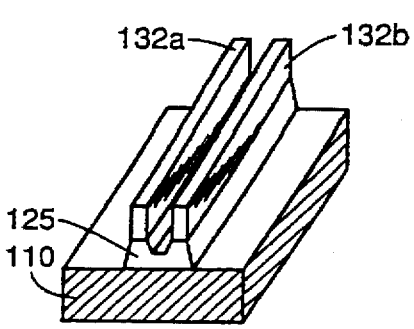
FIG.26   FIG.26A

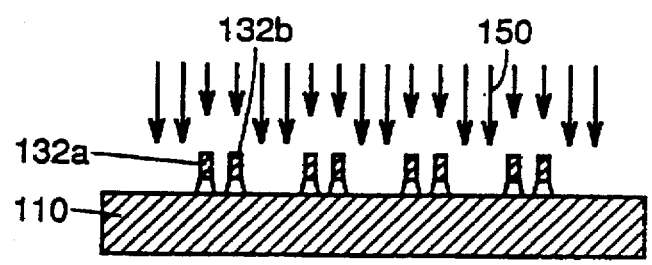
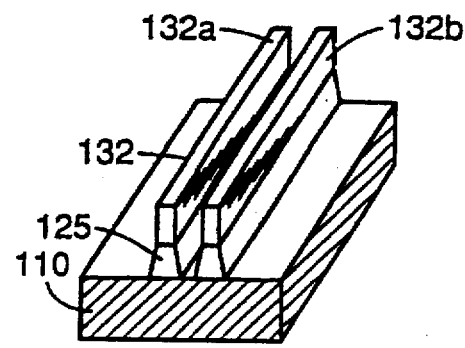
FIG.27  FIG.27A
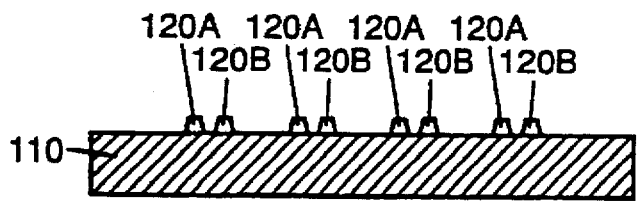
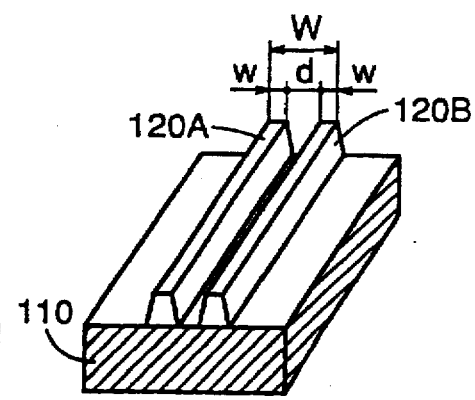
FIG.28  FIG.28A

FIG. 38 PRIOR ART
FIG. 38A PRIOR ART
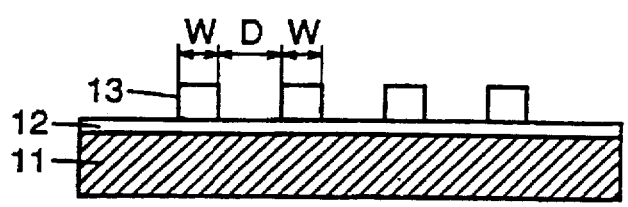
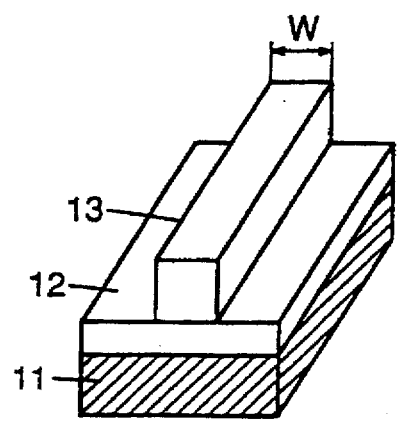
FIG. 39 PRIOR ART
FIG. 39A PRIOR ART
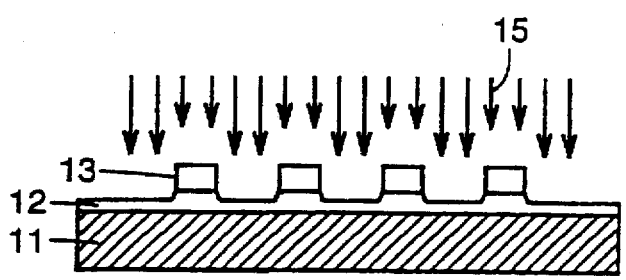
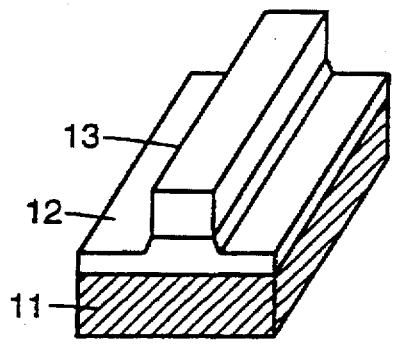
FIG. 40 PRIOR ART
FIG. 40A PRIOR ART
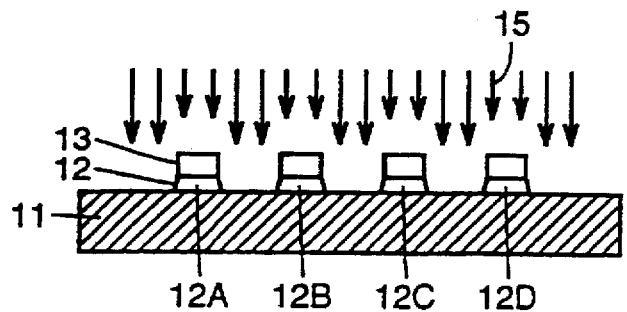
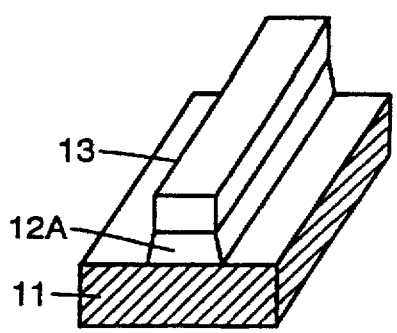

METHOD OF FORMING FINE PATTERNS

This application is a division of application Ser. No. 08/395,025 filed Feb. 27, 1995, now U.S. Pat. No. 5,595,941.

BACKGROUND OF THE INVENTION

1. Field of the Invention

The present invention relates generally to methods of forming fine patterns, and more particularly, to a method of forming patterns arranged in parallel with each other at very fine intervals and having a very fine width.

2. Description of the Background Art

FIGS. 38–41 are cross sectional views and perspective views showing a semiconductor device in each step in the order of a conventional method of forming fine patterns. The fine patterns include interconnection patterns, bit lines, word lines etc.

Referring to FIG. 38, a layer of object to be patterned (hereinafter referred to as object layer) 12 is formed on a support member 11 formed of a silicon dioxide film or the like. Object layer 12 is formed of polycrystalline silicon for example. Patterned resist 13 formed of novolak resin based positive photosensitive resin is formed on object layer 12.

Referring to FIG. 38 and 39, using patterned resist 13 as mask, object layer 12 is etched to remove the portion other than immediately below patterned resist 13 with a removing agent (such as bromine radical) 15 for removing the object layer, and patterns 12A, 12B, 12C and 12D of the object are formed.

Referring to FIGS. 40 and 41, patterned resist 13 is removed.

By the above-described method, patterns arranged in parallel to each other at intervals D and having a width W are provided as illustrated in FIG. 41.

A problem associated with the above method will be now described.

The width (W) of patterns 12A, 12B, 12C or 12D of the object provided according to the conventional method is determined by the pattern width of a light shielding film in the mask used (in the case of using positive photoresist) or the distance between light shielding films (in the case of using negative photoresist). Therefore fine patterns having a width and a size as small as or smaller than the minimum resolution achieved by lithography cannot be formed. In other words, the pattern width (W) and pattern distance (D) are each at least 0.25 μm, and fine patterns having pattern width (W) and distance (D) smaller than this size cannot be formed.

FIGS. 42A–42F are cross sectional views showing a semiconductor device in each step in the order of a method of forming fine patterns according to a prior art (Japanese Patent Laying-Open No. 2-5522) related to the present invention.

Referring to FIG. 42A, resist 2 is formed on a support member 1.

Referring to FIG. 42B, resist 2 is selectively irradiated with a ultraviolet beam, and a latent image 3 is formed.

Referring to FIGS. 42B and 42C, developing resist 2 forms patterned resist 13.

Referring to FIG. 42D, a silylated layer 13a is formed on a surface of patterned resist 13 by irradiating support member 1 with a ultraviolet beam in vapor of hexamethyldisilazane (HMDS). Referring to FIGS. 42D and 42E, silylated layer 13a formed on the top surface of patterned resist 13 is removed by means of reactive ion etching.

Referring to FIGS. 42E and 42F, the not silylated portion of resist 13 is etched away. Thus, fine patterns 16a are formed.

According to the conventional technique, however, a reaction chamber for reacting the photosensitive resin and HMDS must be improved such that a far ultraviolet beam can be introduced into the reaction chamber, which complicates the device and pushes up the cost.

SUMMARY OF THE INVENTION

It is therefore an object of the invention to provide a method of forming patterns arranged in parallel with each other at fine intervals and having a fine width.

Another object of the invention is to provide a method of forming fine patterns having a width and a distance smaller than a minimum resolution achieved by lithography.

Yet another object of the invention is to provide a method of forming fine patters which can be implemented with a simple device.

In a method of forming fine patterns according to a first aspect of the invention, an object layer is formed on a support member. Patterned resist having sidewalls opposite to each other is formed on the object layer. The one and the other sidewalls of the patterned resist are reformed using a reforming agent selected from the group consisting of (a) a carbon trichloride radical, (b) a mixture of silicon ion and oxygen ion, (c) a mixture of carbon ion and carbon monoxide ion, (d) a chlorine radical, (e) aluminum trichloride liquid and (f) dibutyl magnesium liquid, whereby a first reformed portion on the sidewall (hereinafter simply referred to as first sidewall reformed portion) is formed on the one sidewall of the patterned resist, and a second reformed portion on the sidewall (hereinafter referred to as second sidewall reformed portion) on the other sidewall. The not reformed portion of the patterned resist is removed, and thus the first sidewall reformed portion and the second sidewall reformed portion are left on the object layer. Using the first sidewall reformed portion and the second sidewall reformed portion as mask, the portion of the object layer excluding the portion immediately below the first and second sidewall reformed portions are etched away, and thus fine patterns of the object are formed. The first sidewall reformed portion and the second sidewall reformed portions are then removed.

In a method of forming fine patterns according to a second aspect of the invention, an object layer is formed on a support member. Patterned resist having sidewalls opposite to each other is formed on the object layer. The one sidewall and the other sidewall of the patterned resist are reformed, whereby a first sidewall reformed portion is formed on the one sidewall of the patterned resist and a second sidewall reformed portion is formed on the other sidewall. Using the patterned resist including the first and second sidewall reformed portions as mask, the portion of the object layer excluding the portion immediately below the patterned resist is etched away, and patterns of the object are thus formed. The not reformed portion of the patterned resist is removed, and thus the first sidewall reformed portion and the second sidewall reformed portions are left on the patterns of the object. Using the first sidewall reformed portion and second sidewall reformed portion as mask, the portion of the object patterns excluding the portion immediately below the first and second sidewall reformed portions is etched away, and even finer patterns of the object are formed as a result. The first and second sidewall reformed portions are then removed away.

In a method of forming fine patterns according to a third aspect of the invention, an object layer is formed on a support member. Patterned resist having sidewalls opposite to each other is formed on the object layer. Using the patterned resist as mask, the portion of the object layer excluding the portion immediately below the patterned resist is etched away, whereby patterns of the object are formed and at the same time the one and the other sidewalls of the patterned resist are reformed to form a first sidewall reformed portion on the one sidewall of the patterned resist and a second sidewall reformed portion on the other sidewall of patterned resist. The not reformed portion of the patterned resist is removed away, and the first sidewall reformed portion and the second sidewall reformed portion are left on the patterns of the object. Using the first and second sidewall reformed portions as mask, the portion of the patterns of the object excluding the portion immediately below the first and second sidewall reformed portions is etched away, and even finer patterns of the object are formed as a result. The first and second sidewall reformed portions are then removed away.

In a method of forming fine patterns according to a fourth aspect of the invention, an object layer is formed on a support member. Patterned resist having sidewalls opposite to each other is formed on the object layer. Using the patterned resist as mask, the portion of the object layer excluding the portion immediately below the patterned resist is etched away, whereby patterns of the object are formed. The one and the other sidewalls of the patterned resist are reformed, and a first sidewall reformed portion is formed on the one sidewall of the patterned resist and a second sidewall reformed portion is formed on the other sidewall of the patterned resist. The not reformed portion of the patterned resist is removed, and the first and second sidewall reformed portions are thus left on the patterns of the object. Using the first and second sidewall reformed portions as mask, the portion of the patterns of the object excluding the portion immediately below the first and second sidewall reformed portions is etched away, and even finer patterns of the object are formed as a result. The first and second sidewall reformed portions are then removed away.

By the method of forming fine patterns according to the first aspect of the invention, using the first and second sidewall reformed portions formed on the sidewalls of the patterned resist as mask, the portion of the object excluding the portion immediately below the first and second sidewall reformed portions is etched away. Fine patterns of the object layer are thus formed, and therefore patterns even finer than the minimum resolution achieved by the present lithography techniques can be provided.

In addition, the one and the other sidewalls of the patterned resist are reformed using as a reforming agent a carbon trichloride radical ($CCl_3^*$) which tends to dissociate with low energy, and therefore sidewall reformed portions containing a large amount of carbon can be formed on the sidewalls of the patterned resist.

Furthermore, implanting into the sidewalls of patterned resist as a reforming agent two kinds of accelerated particles of (b) the mixture of silicon ion and oxygen ion, or (c) the mixture of carbon ion and carbon monoxide ion causes a chemical change forming a new bond at the sidewall surface of patterned resist, and a sidewall reformed portion having properties unremovable with a removing agent for etching away the object layer or a removing agent for removing the patterned resist can be formed.

Use of a chlorine radical ($Cl_2^*$) as a reforming agent can form a sidewall reformed portion containing a large amount of carbon (C) with a carbon-carbon bond forming the patterned resist being cut.

If the patterned resist is soaked in aluminum trichloride liquid or dibutyl magnesium liquid, aluminum or magnesium atoms permeate into the sidewalls of the patterned resist and form oxide. The oxide is not removed by the removing agent for etching away the object or the removing agent for removing the patterned resist.

By the method of forming fine patterns according to the second aspect of the invention, using the first and second sidewall reformed portions as mask, the portion of patterns of the object excluding the portion immediately below the first and second sidewall reformed portions is etched away, and therefore even finer patterns of the object can be formed.

By the method of forming fine patterns according to the third aspect of the invention, using the patterned resist as mask, the portion of the object layer excluding the portion immediately below the patterned resist is etched away, whereby patterns of the object are formed at which time the one and the other sidewalls of the patterned resist are reformed, and therefore a first sidewall reformed portion is formed on the one sidewall of the patterned resist and a second sidewall reformed portion on the other sidewall, and therefore the manufacturing process can be simplified.

By the method of forming fine patterns according to the fourth aspect of the invention, using the patterned resist as mask, the portion of the object layer excluding the portion immediately below the patterned resist is etched away, and the patterns of the object are thus formed. Thereafter, using the first and the second sidewall reformed portions as mask, the portion of the patterns of the object excluding the portion immediately below the first and second sidewall reformed portions is etched away, and therefore even finer patterns of the object can be formed.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIGS. 1 to 6 are cross sectional views and perspective views showing a semiconductor device in first to sixth steps in the order of a method of forming fine patterns according to Embodiment 1;

FIGS. 7 to 13 are cross sectional views and perspective views showing a semiconductor device in first to seventh steps in the order of a method of forming fine patterns according to Embodiment 2;

FIGS. 14 to 20 are cross sectional views and perspective views showing a semiconductor device in first to seventh steps in the order of a method of forming fine patterns according to Embodiment 3;

FIGS. 21 to 28 are cross sectional views and perspective views showing a semiconductor device in first to eighth steps in the order of a method of forming fine patterns according to Embodiment 4;

FIGS. 38 to 41 are cross sectional views and perspective views showing a semiconductor device in first to fourth steps in the order of a conventional method of forming fine patterns.

DESCRIPTION OF THE PREFERRED EMBODIMENTS

Figures 15, 15A:
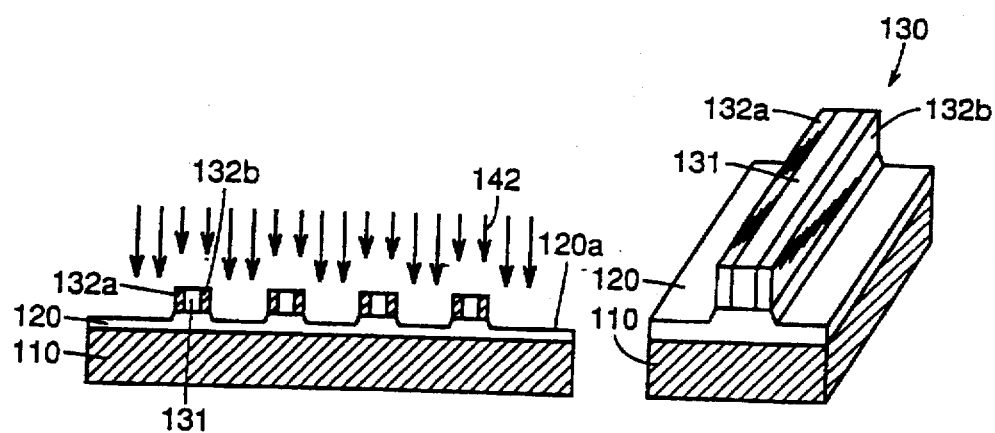

Embodiments of the invention will be now described in conjunction with the accompanying drawings.

Embodiment 1

FIGS. 1 to 6 are cross sectional views and perspective views showing a semiconductor device in each step in the order of a method of forming fine patterns according to Embodiment 1.

Referring to FIG. 1, an object layer 120 such as of polycrystalline silicon is formed on a support member 110 of a silicon dioxide film or the like. Resist patterns 130 of width W arranged parallel to each other and having one sidewall 130a and the other sidewall 130b opposite to each other are formed on object layer 120. Herein width W corresponds to a minimum resolution achieved by the present lithography techniques.

Referring to FIG. 2, as will be described later in detail, one sidewall 130a and the other sidewall 130b of patterned resist 130 are reformed using a reforming agent selected from the group consisting of (a) a carbon trichloride radical, (b) a mixture of silicon ion and oxygen ion, (c) a mixture of carbon ion and carbon monoxide ion, (d) a chlorine radical, (e) aluminum trichloride liquid and (f) dibutyl magnesium liquid. By the reforming, a first sidewall reformed portion 132a is formed on one sidewall 130a of the patterned resist, and a second sidewall reformed portion 132b is formed on the other sidewall 130b of patterned resist.

Referring to FIGS. 2 and 3, the portion of patterned resist 131 which has not been reformed is removed away, and thus first sidewall reformed portion 132a and second sidewall reformed portion 132b arranged in parallel to each other are left on object layer 120.

Referring to FIG. 3, 4, and 5, using first sidewall reformed portion 132a and second sidewall reformed portion 132b as mask, the portion of object layer 120 excluding the position immediately below first and second sidewall reformed portions 132a and 132b is etched away with a removing agent 150 for removing the object.

Referring to FIGS. 5 and 6, removal of first and second sidewall reformed portions 132a and 132b forms patterns 120A and 120B of the object having a fine width w and a fine distance d smaller than the minimum resolution achieved by the present lithography are formed.

Embodiment 2

FIGS. 7 to 13 are cross sectional views and perspective views showing a semiconductor device in each step in the order of a method of forming fine patterns according to Embodiment 2.

An object layer 120 is formed on a support member 110. Resist patterns 130 arranged parallel to each other and having one sidewall and the other sidewall opposite to each other are formed on object layer 120. The one sidewall and the other sidewall of patterned resist 130 are reformed, and a first sidewall reformed portion 132a and a second sidewall reformed portion 132b are thus formed on the one and the other sidewalls of the patterned resist.

Referring to FIGS. 8 and 9, using patterned resist 130 including first sidewall reformed portion 132a and second sidewall reformed portion 132b as mask, the portion of object layer 120 excluding the portion immediately below patterned resist 130 is etched away with a removing agent 150 for removing the object and patterns 125 of the object are thus formed.

Referring to FIGS. 9 and 10, the not reformed portion 131 of patterned resist is removed away, and first sidewall reformed portion 132a and second sidewall reformed portion 132b arranged parallel to each other are left on the pattern 125 of the object.

Referring to FIGS. 11 and 12, using first and second sidewall reformed portion 132a and 132b as mask, the portion of patterns 125 of the object excluding the portion immediately below first and second sidewall reformed portions 132a and 132b is etched away with removing agent 150 for removing the object.

Referring to FIGS. 12 and 13, removal of first and second sidewall reformed portions 132a and 132b forms patterns 120A and 120B of the object having a fine width w and a fine distance d smaller than the minimum resolution achieved by the present lithography techniques.

Embodiment 3

FIGS. 14 to 20 are cross sectional views showing a semiconductor device in each step in the order of a method of forming fine patterns according to Embodiment 3.

Referring to FIG. 14, an object layer 120 is formed on a support member 110. Patterned resist 130 arranged parallel to each other and having one sidewall 130a and the other sidewall 130b is formed on object layer 120.

Figures 16, 16A:
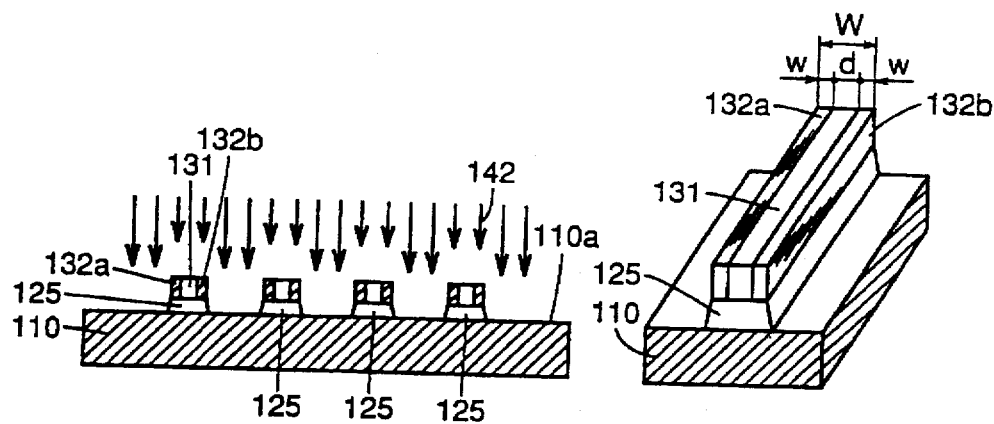

Referring to FIGS. 15 and 16, using patterns 130 as mask, the portion of object layer 120 excluding the portion immediately below patterned resist 130 is etched away, patterns 125 of the object are thus formed, while reforming the one and the other sidewalls of each resist pattern, whereby a first sidewall reformed portion 132a is formed on one sidewall of resist pattern 130, and a second sidewall reformed portion 132b is formed on the other sidewall of resist pattern 130.

In the figures, reference numeral 142 represents a reforming and removing agent capable of reforming the sidewalls of resist pattern 130 and etching away the object layer.

Figures 17, 17A:
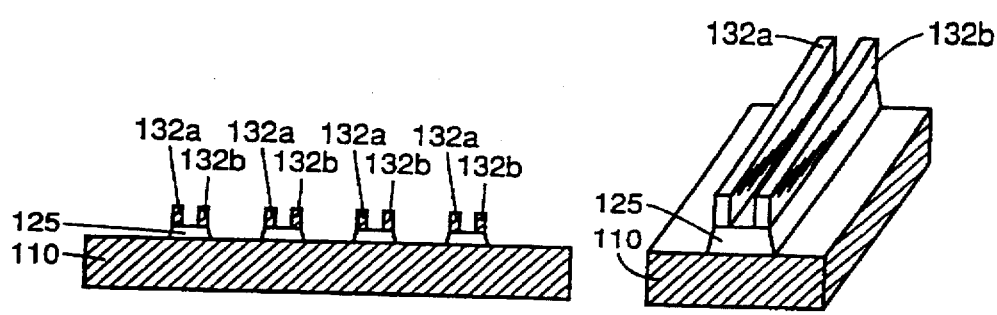

Referring to FIGS. 16 and 17, the not reformed portion 131 of the resist pattern is removed away, and first sidewall reformed portion 132a and second sidewall reformed portion 132b arranged parallel to each other are left on patterns 125 of the object.

Referring to FIGS. 18 and 19, using first and second sidewall reformed portions 132a and 132b as mask, the portion of patterns 120 of the object excluding the portion immediately below first and second sidewall reformed portions 132a and 132b is etched away.

Referring to FIGS. 19 and 20, removal of first and second sidewall reformed portions 132a and 132b forms patterns 120A and 120B of the object having a fine width w and a fine distance d smaller than the minimum resolution achieved by the present lithography techniques.

Embodiment 4

FIGS. 21 to 28 are cross sectional views showing a device in each step in the order of a method of forming fine patterns according to Embodiment 4.

Referring to FIG. 21, an object layer 120 is formed on a support member 110. Resist patterns 130 parallel to each other and having one sidewall 130a and the other sidewall 130b opposite to each other are formed on object layer 120.

Referring to FIGS. 22 and 23, using resist patterns 130 as mask, the portion of object layer 120 excluding the portion immediately below resist patterns 130 is etched away with a removing agent 150 for removing the object, and patterns 125 of the object are thus formed.

Referring to FIG. 24, the one sidewall and the other sidewall of resist pattern 130 are reformed, first sidewall reformed portion 132a is thus formed on the one sidewall of resist pattern and second sidewall reformed portion 132b is formed on the other sidewall of resist pattern.

Referring to FIGS. 24 and 25, the not reformed portion 131 of the resist pattern is removed away, and first sidewall reformed portion 132a and second sidewall reformed portion 132b arranged parallel to each other are left on pattern 125 of the object.

Referring to FIGS. 26 and 27, using first and second sidewall reformed portions 132a and 132b as mask, the portion of patterns 125 of the object excluding the portion immediately below first and second sidewall reformed portions 132a and 132b is etched away.

Referring to FIGS. 27 and 28, removal of first and second sidewall reformed portions 132a and 132b forms patterns 120A and 120B of the object having a fine width w and a fine distance d smaller than the minimum resolution achieved by the present lithography techniques.

Embodiment 5

FIGS. 29A to 29F are cross sectional views showing a semiconductor device in each step in the order of a method of forming fine patterns according to Embodiment 5, and used for illustrating in more detail how the sidewalls of the resist patterns according to Embodiment 1 are reformed.

Figure 29A:
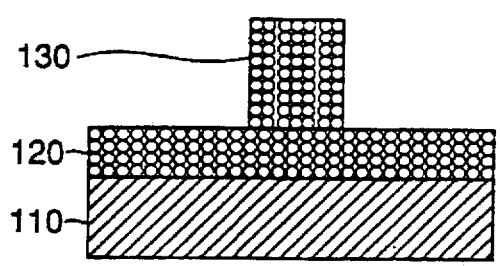
FIGS. 29A to 29F are cross sectional views showing a semiconductor device in each step in the order of a method of forming fine patterns according to Embodiment 5.

Referring to FIG. 29A, an object layer 120 such as of a polysilicon ($SiO_2$) film is formed on a support member 110 for supporting the object formed of silicon dioxide ($SiO_2$) film or the like. A resist pattern 130 formed of novolak resin based positive photosensitive resin for example is formed on object layer 120.

Figure 29B:
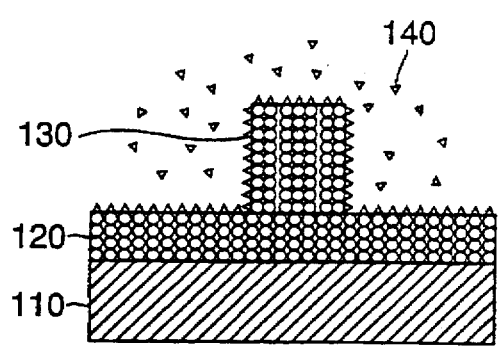

Referring to FIG. 29B, a fixed amount of a reforming agent 140 of a carbon trichloride radical ($CCl_3^*$) is supplied on support member 110 for a fixed time period.

Figure 29C:
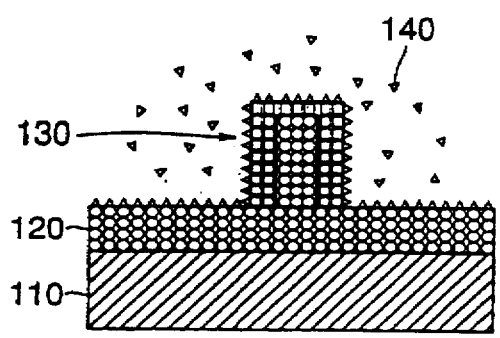

Referring to FIG. 29C, carbon trichloride radical 140 sticks to the surface of patterned resist 130 and the surface of object layer 120, and also enters into patterned resist 130.

Figure 29D:
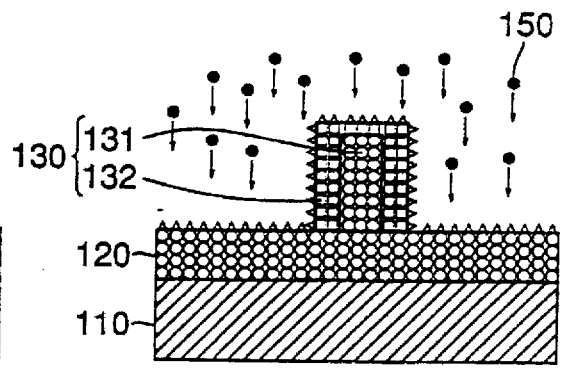

Referring to FIG. 29D, a removing agent 150 for removing the object such as a bromine radical ($Br^*$) having directional dependance i.e. anisotropy is supplied onto support member 110. Since a carbon trichloride radical ($CCl_3^*$) which dissociates a carbon atom (C) with low energy dissociates with the energy imparted by removing agent 150 for removing the object, a thin carbon film is formed on the surface of patterned resist 130, and carbon atoms come into patterned resist 130 from the surface to form sidewall reformed portion 132.

Figure 29E:
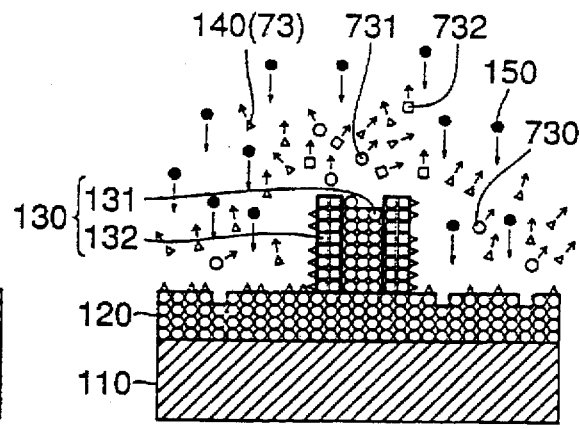

Referring to FIG. 29E, in the process of forming sidewall reformed portion 132, part of object layer 120, in other words part of the polysilicon film forms a reaction product 730 such as silicon tetrachloride ($SiCl_4$) and silicon tetrabromide ($SiBr_4$) to be removed, and part of patterned resist 130 forms a reaction product 731 such a carbon tetrachloride ($CCl_4$) and carbon tetrabromide ($CBr_4$) to be removed. Part of the carbon trichloride radical ($CCl_3^*$) returns to its ground state, and forms another reaction product, carbon tetrachloride 732. These reaction products dissipate externally. The upper end of patterned resist 130 has partially removed by the function of removing agent 150 for removing the object.

Figure 29F:
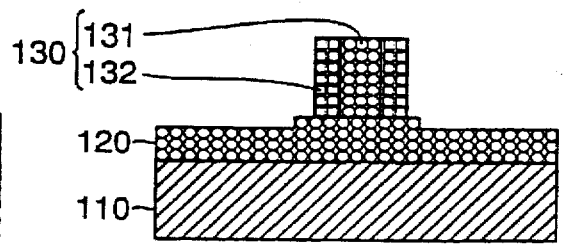

Finally as illustrated in FIG. 29F, formed on a sidewall of the patterned resist is a sidewall reformed portion 132 entered with a carbon thin film and/or carbon which cannot be completely removed with the removing agent for removing the patterned resist such as an oxygen radical ($O^*$). Note that 131 represents the not reformed portion of the patterned resist.

Figure 32:
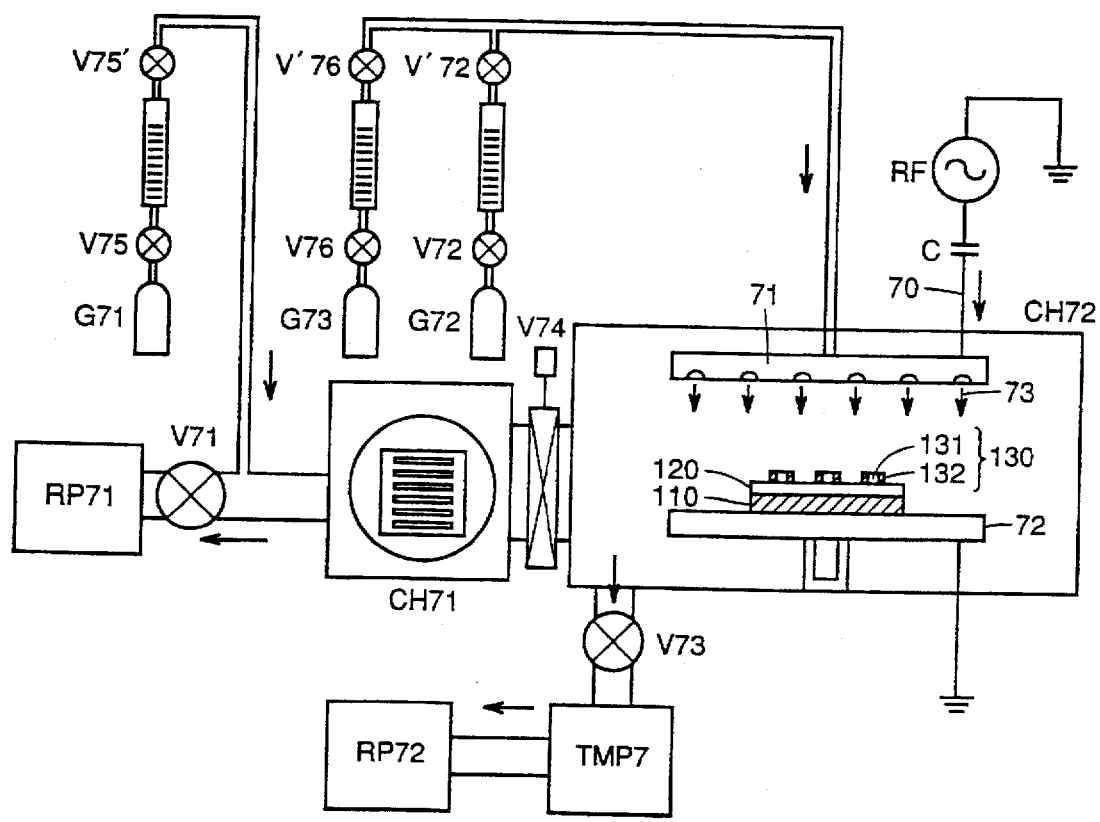
FIG. 32 is a representation illustrating the concept of a plasma device used according to the present invention.

The above carbon trichloride radical ($CCl_3^*$) is produced by a commonly used plasma device as illustrated in FIG. 32. The plasma device includes a spare chamber CH71 and a reaction chamber CH72. In reaction chamber CH72, an electrode A(71) and an electrode B(72) are provided. Electrode B(72) also functions as a stand for an object. Gas G72 is supplied to electrode A(71) through a pressure regulator V72 and a flow rate regulator V72'. Gas G73 is supplied to electrode A(71) through a pressure regulator V76 and a flow rate regulator V76'. Reaction chamber CH72 is connected to a turbo molecular pump TMP7 through valve V73. Turbo molecular pump TMP7 is connected to a rotary pump RP72. Spare chamber CH71 and reaction chamber CH72 are connected to each other through a gate valve V74. Spare chamber CH71 is connected to a rotary pump RP71 through valve V71. Spare chamber 71 is supplied with gas G71. Gas 71 is supplied into spare chamber CH71 through a pressure regulator V75 and a flow rate regulator V75'.

Reaction chamber CH72 is connected to an electromagnetic wave generator RF through a coupling capacitor C.

A carbon trichloride radical ($CCl_3^*$) can be produced by supplying a mixture gas of helium gas (G72) at a flow rate of 100 SCCM (Standard Cubic Centimeter Per Minute) via pressure and flow rate regulators V72 and V'72 and carbon tetrachloride gas (G73) at a flow rate in the range from 60 to 80 SCCM via pressure and flow rate regulators V76 and V76', and then plasma-dissociating them under a pressure in the range from 1.0 to 1.5 Torr.

Sidewall reformed portion 132 formed with reforming agent 140 of carbon trichloride radical ($CCl_3^*$) comes to have such a property that $ER_{01}$ (the rate at which the not reformed portion 131 of the patterned resist is removed) is in the range from 100 to 140 nm/min, and $ER_{02}$ (the rate at which sidewall reformed portion 132 is removed by the removing agent for removing the object) is in the range from 25 to 35 nm/min by the function of removing agent 150 for removing the object such as a bromine radical ($Br^*$). $Er_{11}$ (the rate of removing the not reformed portion 131 of the patterned resist) given by the removing agent for removing the patterned resist such as an oxygen radical ($O^*$) was in the range from 115 to 135 nm/min, and $Er_{12}$ (the rate of removing sidewall reformed portion 132) was in the range from 15 to 25 nm/min.

Embodiment 6

Another example of the process of reforming sidewalls of the patterned resist according to Embodiment 1 will be described in the following.

In this embodiment, accelerated particles formed of two kinds of ions are used as a reforming agent for forming such a sidewall reformed portion.

Figure 30A:
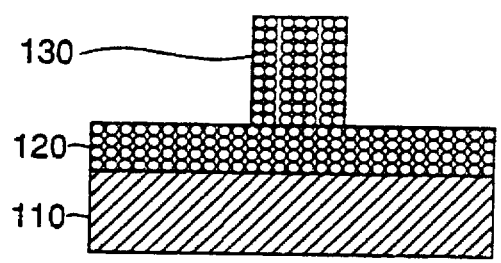
FIGS. 30A to 30F are cross sectional views showing a semiconductor device in each step in the order of a method of forming fine patterns according to Embodiment 6.

Referring to FIG. 30A, object layer 120 is formed on support member 110. Patterned resist 130 is formed on object layer 120.

Figure 30B:
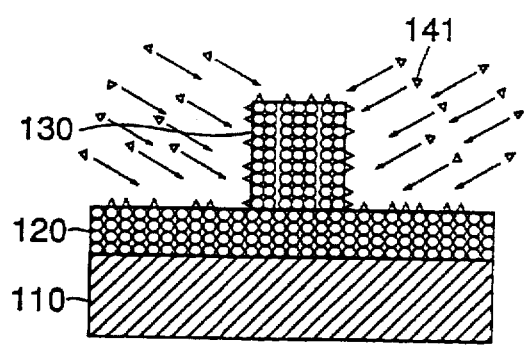

Referring to FIG. 30B, a reforming agent 141 of accelerated particles formed of two kinds of ions such as silicon ions ($Si^+$) and oxygen ions ($O^+$) or carbon ions ($C^+$) and carbon monoxide ions ($CO^+$) is supplied in a fixed amount for a fixed time period toward sidewalls of patterned resist 130. Reforming agent 141 either reacts with patterned resist 130 or enters into patterned resist 130, and a chemical change forming a new chemical bond such as Si—O and C—O occurs on the surface of patterned resist 130.

Figure 30C:
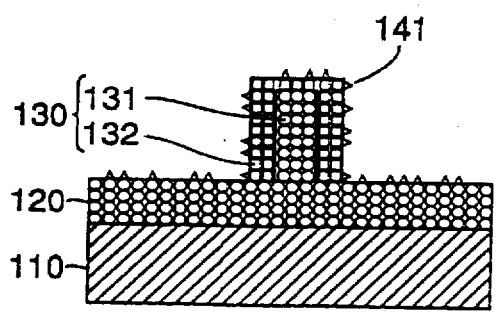

As a result, referring to FIG. 30C, sidewall reformed portion 132 which has changed as far as a prescribed depth forms on the surface of patterned resist 130. In the figure 131 represents the not reformed portion of the patterned resist.

Figure 30D:
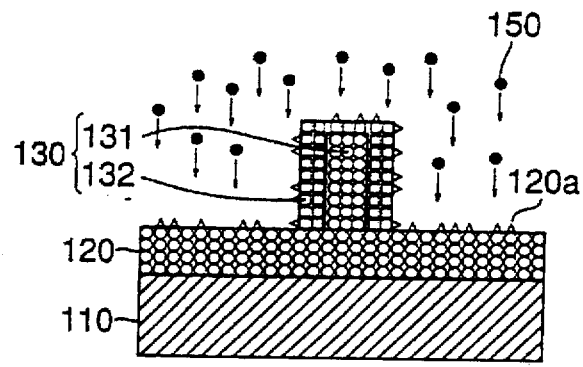
Figure 30E:
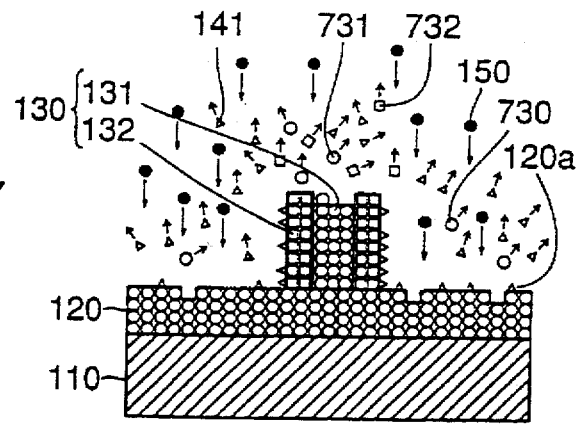

Referring to FIG. 30D, a removing agent 150 for removing the object such as a bromine radical ($Br^*$) having directional dependence i.e. anisotropy is supplied onto support member 110.

Figure 30F:
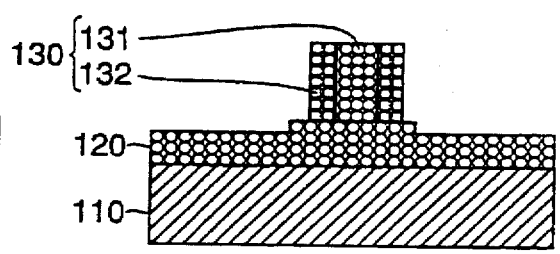

Referring to FIG. 30F, object layer 120, the polycrystalline silicon film for example forms into a reaction product $A(730)$ of silicon tetrabromide ($SiBr_4$), part of patterned resist 130 forms into a reaction product $B(731)$ of carbon tetrabromide ($CBr_4$) for example, and part of the accelerated particles of reforming agent 141 which has come into patterned resist 130 forms into a reaction product $C(732)$ of silicon tetrabromide ($SiBr_4$) or carbon tetrabromide ($CBr_4$). These reaction products dissipate externally. Supplying removing agent 150 for removing the object in a fixed amount for a fixed time period forms sidewall reformed portion 130 containing chemical bonds of silicon (Si) and carbon (C) which cannot be completely removed with removing agent 150 for removing the object or the removing agent for removing the not reformed portion 131 of the patterned resist.

The accelerated particles of reforming agent 141 can be produced with a commonly used ion implantation device. Accelerated particles can be directed obliquely toward patterned resist 130 by changing the angle at which the accelerated particles are irradiated. The depth to which the accelerated particles come into patterned resist 130 is determined by changing easily controllable ion energy. Therefore, the width (w) of sidewall reformed portion 132 can be readily controlled. For example for silicon ions ($Si^+$) and oxygen ions ($CO^+$) with an implantation energy of 50 keV in a dose of $10^{16}$ atoms/$cm^2$, the depths of the highest portions of the concentration of the implanted ions are 115 nm and 70 nm, and sidewall reformed portion 132 having a width corresponding to the depths is formed. $ER_{O1}$ by the removing agent for removing the object such as a bromine radical ($Br^*$) is in the range from 50 to 70 nm/min, and $ER_{O2}$ is in the range from 15 to 25 nm/min. The removing agent for removing the patterned resist such as an oxygen radical ($O^*$) was in the range from 115 to 135 nm/min and $ER_{12}$ was in the range from 5 to 10 nm/min.

Embodiment 7

FIGS. 31A to 31E are schematic representations for use in illustration of a process of reforming sidewalls of patterned resist in Embodiment 7.

In this embodiment, a chlorine radical ($Cl_2^*$) capable of forming a sidewall reformed portion on the sidewall of patterned resist and of removing an object layer as well is used as a reforming agent.

Figure 31A:
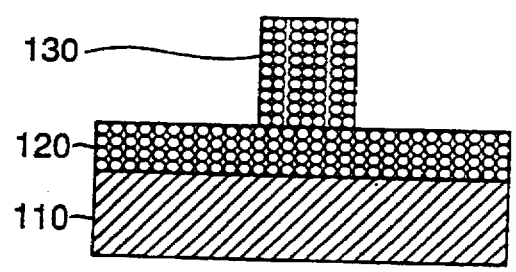
FIGS. 31A to 31E are cross sectional views showing a semiconductor device in each step in the order of a method of forming fine patterns according to Embodiment 7.

Referring to FIG. 31A, an object layer 120 is formed on a support member 110. Patterned resist 130 is formed on object layer 120.

Figure 31D:
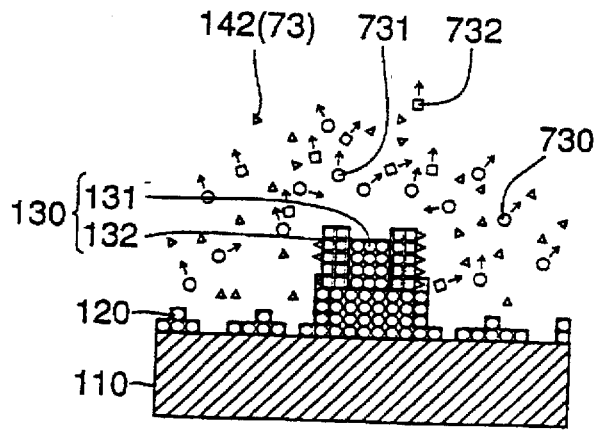
Figure 31B:
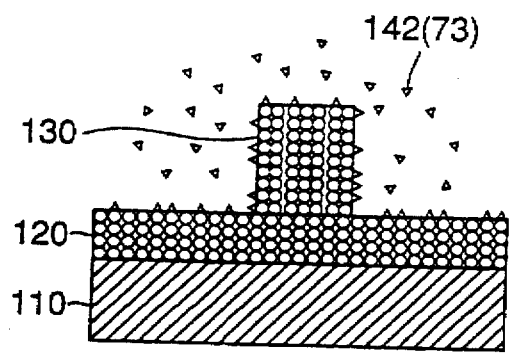

Referring to FIG. 31B, a fixed amount of a chlorine radical ($Cl_2^*$), a reforming and removing agent 142 having directional dependence i.e. anisotropy is supplied onto support member 110 for a fixed time period.

Figure 31E:
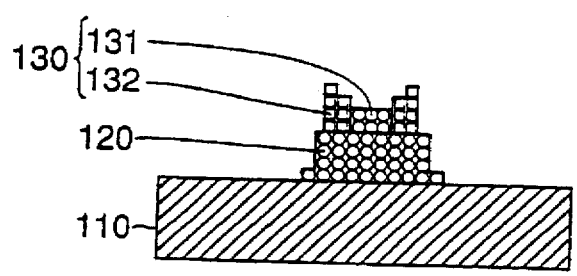
Figure 31C:
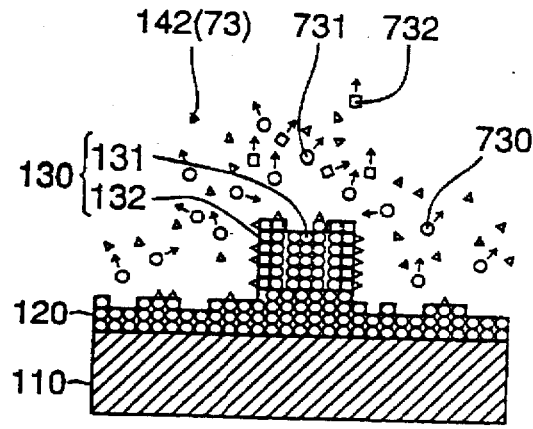

Referring to FIG. 31C, the chlorine radical ($Cl_2^*$) reacts with object layer 120 in other words polycrystalline silicon and forms into a reaction product $A(730)$ of silicon tetrachloride ($SiCl_4$). Part of patterned resist 130 forms into a reaction product $B(731)$ such as carbon tetrachloride ($CCl_4$). Part of the chlorine radical ($Cl_2^*$) returns to its ground state, and forms into another reaction product $C(732)$, chlorine. These reaction products dissipate externally as illustrated in FIG. 31C. Although part of the surface of patterned resist 130 dissipates in the form of reaction product $B(731)$, since a chlorine radical ($Cl_2^*$) is more active than a carbon trichloride radical ($CCl_3^*$), the bond (—C—) of patterned resist 130 is cut off, and sidewall reformed portion 132 containing a large amount of carbon (C) forms on the side surface of patterned resist 130. Most of chlorine radicals ($Cl_2^*$) sticking onto the surface of object layer 120 react with object layer 120, and dissipate externally in the form reaction product $A(730)$ as illustrated in FIG. 31D, and thus function to remove object layer 120. As a result, supply of a fixed amount of chlorine radical ($Cl_2^*$) for a fixed time period removes object layer 120, and finally sidewall reformed portion 132 entered with a carbon thin film and/or carbon which cannot be completely removed with a removing agent (such as oxygen radical ($O^*$)) for removing the not reformed portion of the patterned resist is formed on a sidewall of patterned resist 130 as illustrated in FIG. 31E.

The chlorine radical ($Cl_2^*$) can be produced with a commonly used plasma device as illustrated in FIG. 32. More specifically, a mixture gas of helium gas ($G72$) at a flow rate of 100 SCCM through pressure and flow rate regulators V72 and V'72 and chlorine gas ($G72$) at a flow rate of 100 SCCM through pressure and flow rate regulators V76 and V'76 is subjected to plasma-dissociation between electrode A(71) and electrode B(72) under a pressure of 250 m Torr. A generated reaction product is let out with helium gas ($G72$). If the temperature of a station (72) for an object is in the range from 50° to 60° C., a radio wave power is in the range from 220 to 260 W, and the distance between electrode A(73) and object (120) is 1.1 cm, object 120 is removed at such a rate at which $ER_{20}$ (the rate of removing the object with reforming and removing agent 142) is in the range from 450 to 500 nm/min, and sidewall reformed portion 132 having a width in the range from 0.15 to 0.25 μm forms. $ER_{41}$ (the rate at which the not reformed portion 131 of the patterned resist is removed with reforming and removing agent 142) is in the range from 220 to 260 nm/min, $ER_{42}$ (the rate at which sidewall reformed portion 132 is removed with reforming and removing agent 142) is in the range from 60 to 80 nm/min, and $ER_{43}$ (the rate at which the support member for supporting the object is removed with reforming and removing agent 142) is in the range from 15 to 20 nm/min.

Figure 33:
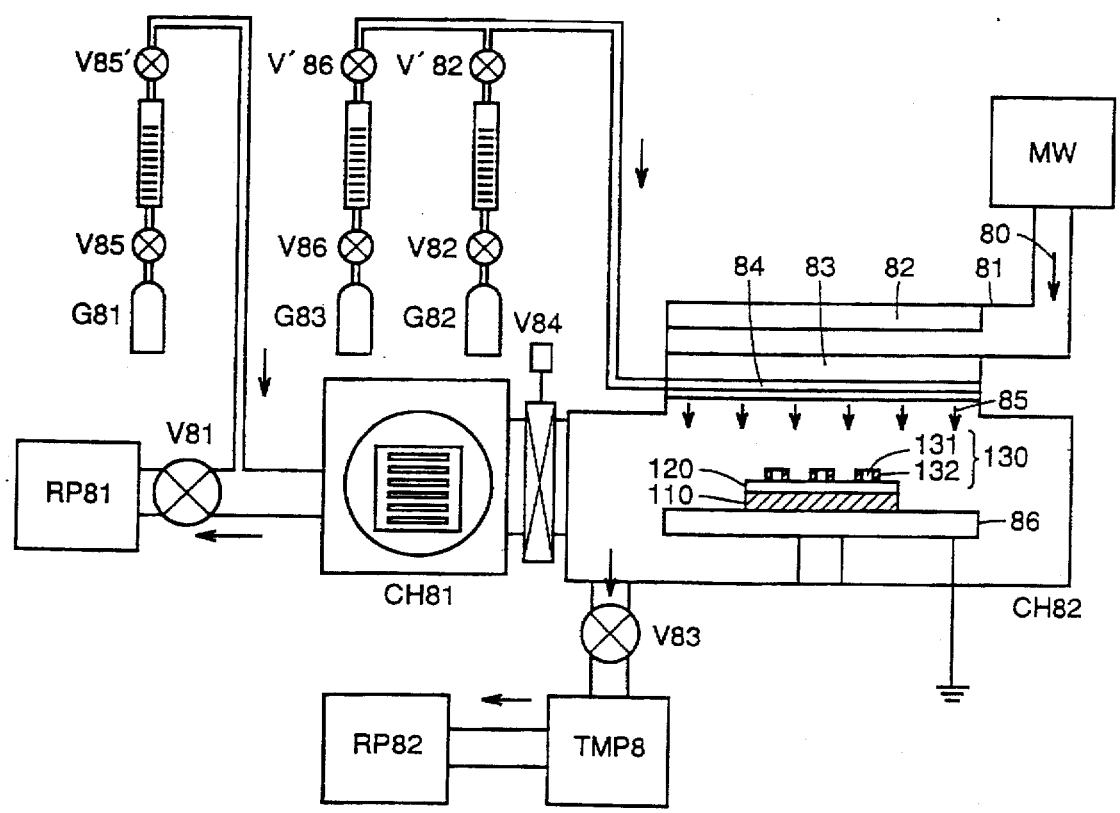
FIG. 33 is a representation illustrating the concept of an ashing device used according to the present invention.

Reforming and removing agent 142 or removing agent 150 for removing the object described above is formed with a commonly used plasma device as illustrated in FIG. 32. FIG. 33 is a representation showing the arrangement of an ashing device for generating a removing agent for removing the not reformed portion of the patterned resist.

In FIG. 33, CH82 is a reaction chamber, and CH81 is a spare chamber for keeping an object for a while. RP81 and V81 are a rotary pump and a valve for exhausting spare chamber CH81. Gas 81 such as nitrogen is introduced into spare chamber CH81 through pressure and flow rate regulars V85 and V'85, and the chamber is exhausted by rotary pump RP81. After repeating introduction/exhaustion of the nitrogen gas, spare chamber CH81 is brought into a vacuum of $10^{-2}$ Torr, in which an object to be processed is kept. Reaction chamber CH82 installed with the object is brought into a vacuum of $10^{-4}$ Torr by a turbo molecular pump TMP8 and a rotary pump RP82, and the residual gas is let out. In the figure (MW) represents an electromagnetic wave generator. (80) is a microwave generated by electromagnetic wave generator (MW), and (81) is a waveguide. (82) is a teflon plate for matching waveguide 81 and reaction chamber CH82. An alumina ($Al_2O_3$) window plate 83 partitions the space between waveguide 81 and reaction chamber CH82, and introduces microwave 80 from waveguide 81 into reaction chamber CH82. Reaction cheer CH82 is provided with a shower head 84. Reactive particles to function as a removing agent for removing the patterned resist is blown from shower head 84. Support member 110 is placed on a station 86 for an object.

An oxygen radical (O*), an example of such a removing agent for removing the patterned resist is produced as follows as illustrated in FIG. 33. A microwave 80 at 2.45GHz generated by electromagnetic wave generator (MW) is introduced into reaction chamber CH82 through waveguide 81. Dissociating oxygen $O_2$ gas (G83) under a pressure in the range from 1 to 2 Torr at a flow rate of 1000 SCCM through pressure and flow rate regulators V86 and V'86 provides an oxygen radical (O*). If the temperature of object station 86 is in the range from 100° to 200° C., the microwave power is in the range from 400 to 1500 W, and the distance between the shower head from which oxygen radical 85 is discharged and the not reformed portion 131 of patterned resist is in the range from 5 to 6 cm, the not reformed portion 131 of patterned resist is removed away at a removing rate in the range from 1 to 2 μm/min.

Embodiment 8

In this embodiment, aluminum trichloride ($AlCl_3$) liquid or dibutyl magnesium [$Mg(Bu)_2$] liquid is used as a reforming agent. For aluminum, aluminum trichloride ($AlCl_3$) liquid is used. The aluminum trichloride liquid is produced by dissolving 1.8 mol/l aluminum trichloride into a solvent of nitrobenzene. For magnesium, dibutyl magnesium liquid or diethyl magnesium liquid is used. Dibutyl magnesium liquid is produced by dissolving 0.7 mol/l dibutyl magnesium in a solvent of heptane. The diethyl magnesium liquid is produced by dissolving 0.7 mol/l diethyl magnesium in a solvent of diethylether. The support member with the patterned resist formed thereon is soaked in the dibutyl magnesium liquid or diethyl magnesium liquid for one minute and then washed with toluene and then hexane. Then, drying is conducted by blowing nitrogen gas. The series of treatments are all conducted in nitrogen gas. Through these treatments, referring to FIG. 1, for example, metal atoms of aluminum or magnesium come into the surface of patterned resist 130 from its surface. These metals are oxidized with oxygen present in patterned resist 130 and form an inorganic substance. The inorganic substance and an organic substance of the patterned resist in the form of a matrix form sidewall reformed portions 132a and 132b. Sidewall reformed portions 132a and 132b are formed to have such a property that they are not removed with a removing agent for removing the object or a removing agent for removing the patterned resist.

Sidewall reformed portions 132a and 132b treated with dibutyl magnesium liquid exhibit the following property. For example, $ER_{O1}$ (the rate at which the not reformed portion 131 of patterned resist is removed secondarily by the removing agent for removing the object) with removing agent 150 for removing the object is in the range from 50 to 70 nm/min, and $ER_{O2}$ (the rate at which sidewall reformed portions 132a and 132b are removed with removing agent 150 for removing the object) is in the range from 5 to 15 nm/min.

In addition, $ER_{11}$ (the rate at which the not reformed portion 131 of patterned resist is removed with the removing agent for removing patterned resist) with the removing agent for removing the patterned resist is in the range from 115 to 135 nm/min, and $ER_{12}$ (the rate at which sidewall reformed portions 132a and 132b are removed with the removing agent for removing the patterned resist) is in the range from 5 to 15 nm/min.

In this embodiment, the patterned resist is soaked in aluminum trichloride liquid or dibutyl magnesium liquid, and the liquid is made to permeate into the surface of the patterned resist and thus sidewall reformed portions 132a and 132b are formed. The width (w) of sidewall reformed portions 132a and 132b can be controlled based on time for soaking.

As a removing agent for removing a sidewall reformed portion, a hydrofluoric acid aqueous solution or a buffer hydrofluoric acid aqueous solution is used. The hydrofluoric acid aqueous solution used has a volume ratio of water and hydrofluoric acid (HF content: 50%) of 10-50:1. The buffer hydrofluoric acid aqueous solution used has a volume ratio of ammonium fluoride ($NH_4F$ content: 40%) and hydrofluoric acid of 5-10:1. Removal of a sidewall reformed portion with the removing agent for removing the sidewall reformed portion also has a mechanism of removing by the function of a so-called lift off effect, and the removing rate $ER_{22}$ (the rate at which sidewall reformed portions 132a and 132b are removed with the removing agent for removing the sidewall reformed portions) is 5 to 6 seconds. For the removing time, $ER_{20}$ (the rate at which object 120 is removed with the removing agent for removing sidewall reformed portion) and $ER_{23}$ (the rate at which support member 110 is removed with the removing agent for removing sidewall reformed portion) are very small.

Embodiment 9

In this embodiment, a carbon trichloride radical and a mixture of silicon ion and oxygen ion are selected as a reforming agent for forming a sidewall reformed portion. Using the carbon trichloride radical, one and the other sidewalls of patterned resist are reformed. Then, using the mixture of silicon ion and oxygen ion, one and the other sidewalls of patterned resist are once again reformed. By such a method, the advantages of both (by the first reforming treatment and the second reforming treatment) are exhibited, and high performance sidewall reformed portions are formed.

Embodiment 10

In this embodiment, a carbon trichloride radical and a mixture of carbon ion and carbon monoxide ion are selected as reforming agents for forming sidewall reformed portions. One and the other sidewalls of patterned resist are reformed with the carbon trichloride radical. Then, using the mixture of carbon ion and carbon monoxide ion, the one and the other sidewalls of patterned resist are once again reformed.

By such a method, both advantages are synergistically exhibited, and sidewall reformed portions with excellent performance are provided.

Embodiment 11

In this embodiment, a chlorine radical and a mixture of silicon ion and oxygen ion are selected as reforming agents for forming sidewall reformed portions. With the chlorine radical, one and other sidewalls of patterned resist are reformed. Then, with the mixture of silicon ion and oxygen ion, the one and the other sidewalls of patterned resist are once again reformed. By such a method, both advantages are synergistically exhibited, and sidewall reformed portions obtained will give excellent performance.

Embodiment 12

In this embodiment, a chlorine radical and a mixture of carbon ion and carbon monoxide ion are selected as reforming agents for forming sidewall reformed portions. With the chlorine radical, one and the other sidewalls of patterned resist are reformed. Then, with the mixture of carbon ion and carbon monoxide ion, the one and the other sidewalls of patterned resist are once again reformed. By such a method, both advantages are synergistically exhibited, and sidewall reformed portions obtained will give excellent performance.

Embodiment 13

In this embodiment, aluminum trichloride liquid and a mixture of silicon ion and oxygen ion are selected as reforming agents for forming sidewall reformed portions. Using the aluminum trichloride liquid, one and the other sidewalls of patterned resist are reformed. Then, with the mixture of silicon ion and oxygen ion, the one and the other sidewalls of patterned resist are once again reformed. By such a method, both advantages are synergistically exhibited and the sidewall reformed portions obtained will have excellent performance.

Embodiment 14

In this embodiment, aluminum trichloride liquid and (c) a mixture of carbon ion and carbon monoxide ion are selected as reforming agents for forming sidewall reformed portions. One and the other sidewalls of patterned resist are reformed using the aluminum trichloride liquid. Then, with the mixture of carbon ion and carbon monoxide ion, the one and the other sidewalls of patterned resist are once again reformed. By such a method, both advantages are synergistically exhibited, and sidewall reformed portions obtained will give excellent performance.

Embodiment 15

In this embodiment, (f) dibutyl magnesium liquid, and (b) a mixture of silicon ion and oxygen ion are selected as reforming agents for forming sidewall reformed portions. Using the dibutyl magnesium liquid, one and the other sidewalls of patterned resist are reformed. Then, with the mixture of silicon ion and oxygen ion, the one and the other sidewalls of patterned resist are once again reformed. By such a method, both advantages are synergistically exhibited, and sidewall reformed portions formed will give excellent performance.

Embodiment 16

In this embodiment, (f) a dibutyl magnesium liquid and (c) a mixture of carbon ion and carbon monoxide ion are selected as reforming agents for forming sidewall reformed portions. Using the dibutyl magnesium liquid, one and the other sidewalls of patterned resist are reformed. Then, with the mixture of carbon ion and carbon monoxide ion, the one and the other sidewalls of patterned resist are once again reformed. By such a method, both advantages are synergistically exhibited, and sidewall reformed portions formed will give excellent performance.

Embodiment 17

This embodiment relates to a method of further working fine patterns obtained according to the above-described methods.

Figure 34A:
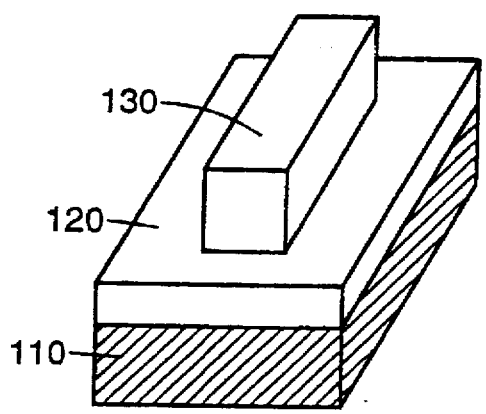
FIGS. 34A to 34F are views showing a process preceding to a method of forming fine patterns according to Embodiment 17.

Referring to FIG. 34A, an object layer 120 is formed on a support member 110. Patterned resist 130 is formed on object layer 120.

Figure 34D:
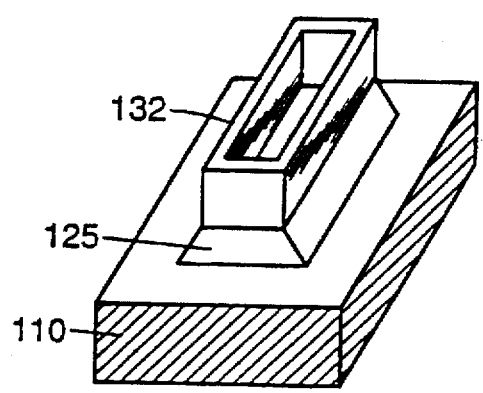
Figure 34B:
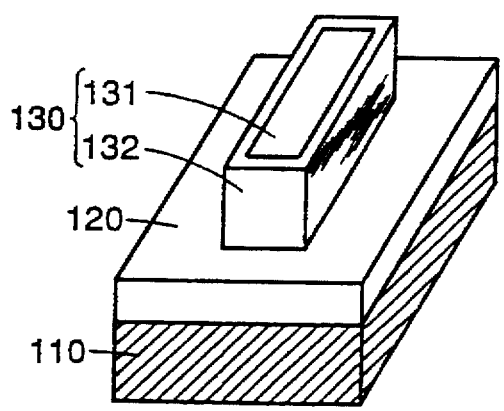

Referring to FIG. 34B, A sidewall of patterned resist 130 is reformed and a sidewall reformed portion 132 is formed. Using patterned resist 130 including sidewall reformed portion 132 as mask, the portion of object layer 120 excluding the portion immediately below patterned resist 130 is etched away, and a pattern 125 of the object is thus formed.

Figure 34E:
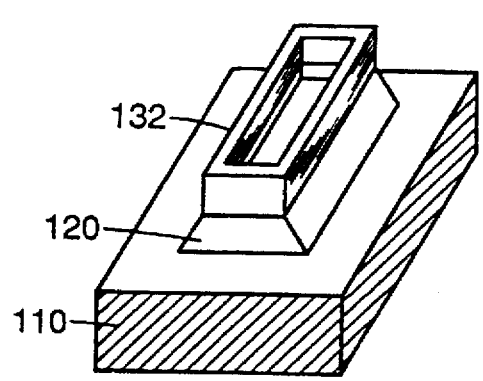
Figure 34C:
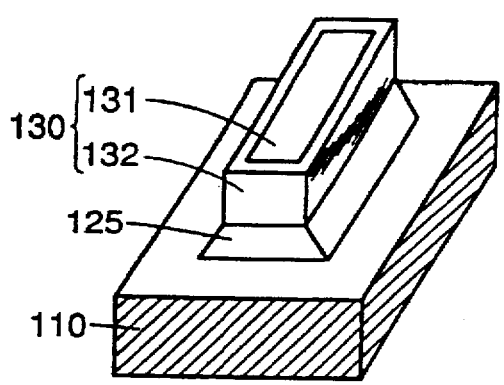

Referring to FIGS. 34C and 34D, the not reformed portion 131 of patterned resist 130 is removed away, and sidewall reformed portion 132 is left on pattern 125 of the object.

Referring to FIG. 34E, using sidewall reformed portion 132 as mask, the portion of pattern 125 of the object excluding the portion immediately below sidewall reformed portion 132 is etched away.

Figure 34F:
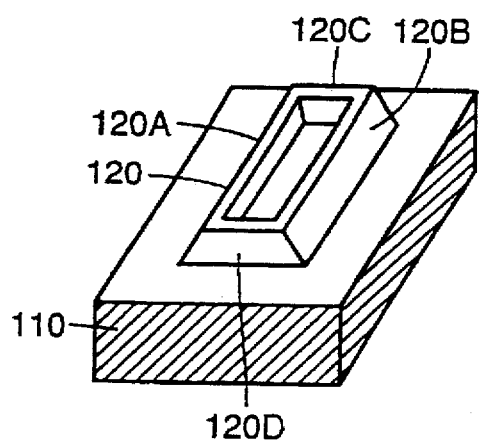

Referring to FIG. 34F, by removal of the sidewall reformed portion, a pair of fine patterns 120A and 120B parallel to each other, and a pair of fine patterns 120C and 120D linking ends of the pair of fine patterns 120A and 120B are formed.

Figure 35A:
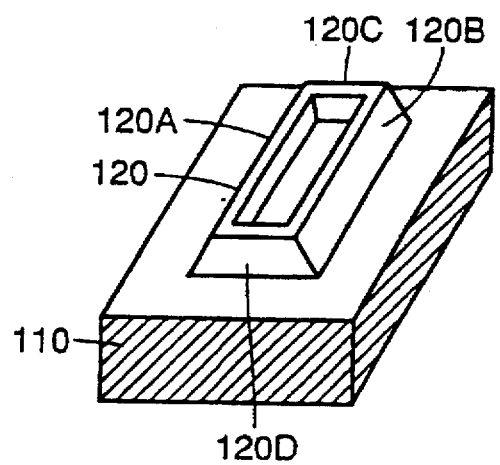
FIGS. 35A to 35D are perspective views showing a semiconductor device in each step in the order of the method of forming fine patterns according to Embodiment 17.

FIG. 35A corresponds to FIG. 34F.

Figure 35D:
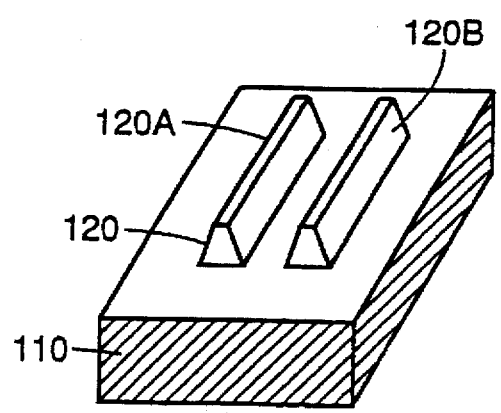
Figure 35B:
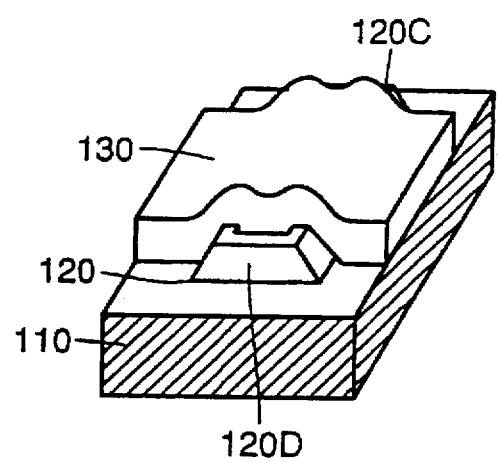

Referring to FIG. 35B, in order to expose pair of fine patterns 120C and 120D, resist 130 is applied on pattern 120 of the object.

Figure 35C:
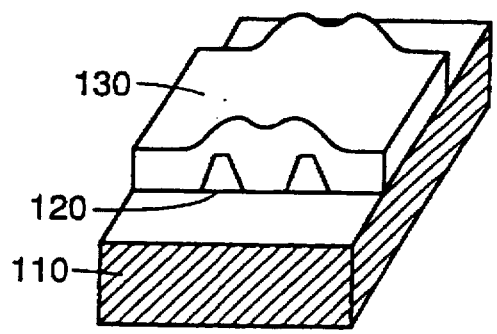

Referring to FIGS. 35B and 35C, using resist 130 as mask, pair of fine patterns 120C and 120D are etched away. Then, removal of resist 130 provides a pair of fine patterns 120A and 120B arranged parallel to each other as illustrated in FIG. 35D.

Embodiment 18

Figure 36A:
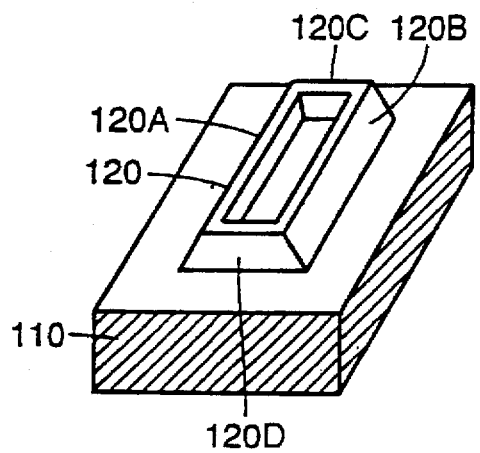
FIGS. 36A to 36D are perspective views showing a semiconductor device in each step in the order of a method of forming fine patterns according to Embodiment 18.
Figure 36D:
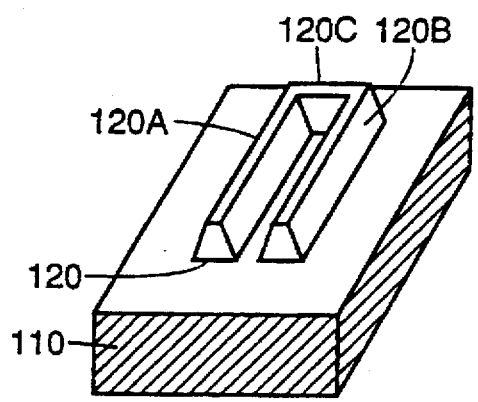

FIG. 36A and 36D are perspective views showing a method of forming fine patterns according to Embodiment 18. FIG. 36A corresponds to FIG. 34F.

Figure 36B:
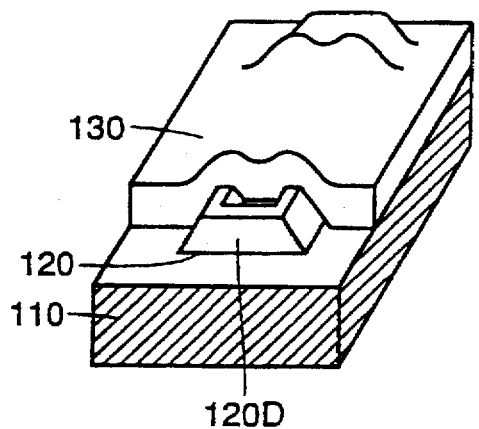

Referring to FIGS. 36A and 36B, resist 130 is formed on fine pattern 120 so as to expose only one fine pattern 120D of pair of fine patterns 120C and 120D arranged parallel to each other.

Figure 36C:
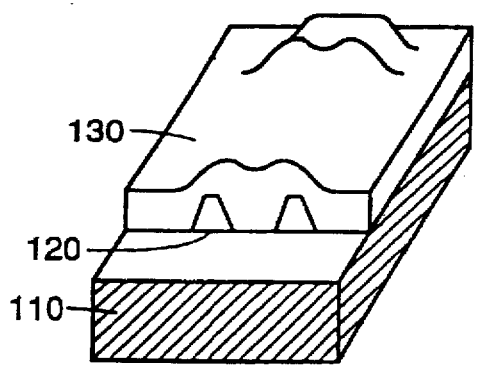

Referring to FIG. 36C, using resist 130 as mask, the one fine pattern 120D is etched away.

Referring to FIGS. 36C and 36D, removal of patterned resist 130 forms a pair of fine patterns 120A and 120B arranged parallel to each other and a fine pattern 120C linking their ends.

Embodiment 19

FIGS. 37A to 37D are perspective views showing a method of forming fine patterns according to Embodiment 19.

Figure 37A:
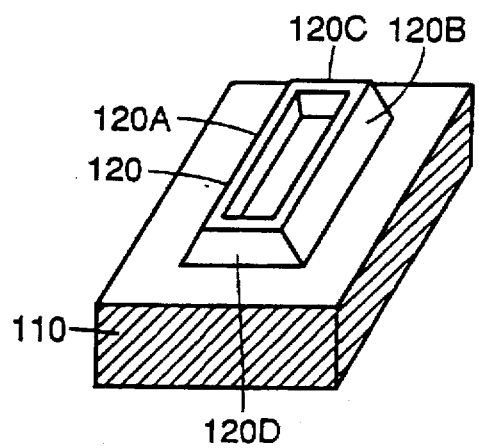
FIGS. 37A to 37D are perspective views showing a semiconductor device in each step in the order of a method of forming fine patterns according to Embodiment 19.

FIG. 37A corresponds to FIG. 34F.

Figure 37D:
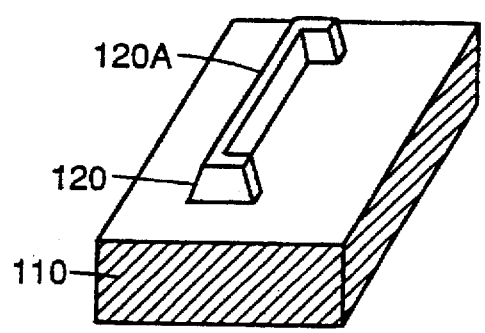
Figure 37B:
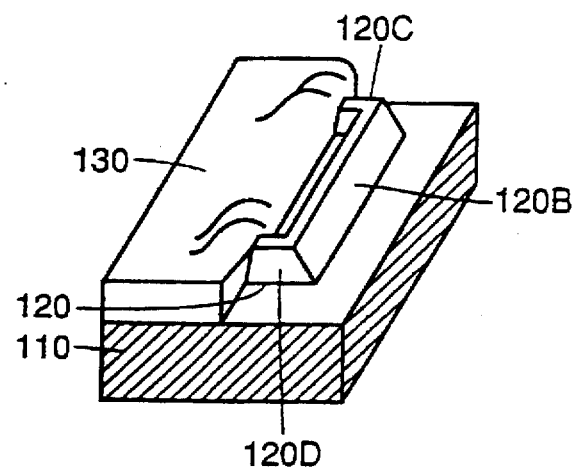

Referring to FIG. 37B, resist 130 is formed on a support member 110 so as to expose fine pattern 120B, part of fine pattern 120C, and part of fine pattern 120D.

Figure 37C:
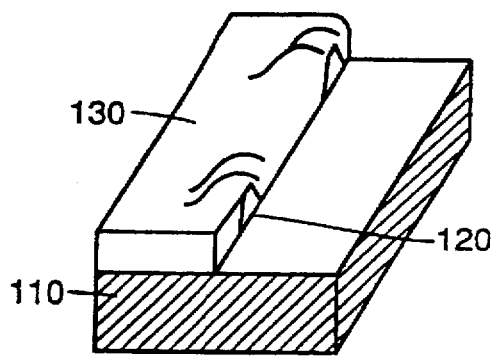
Figures 41, 41A:
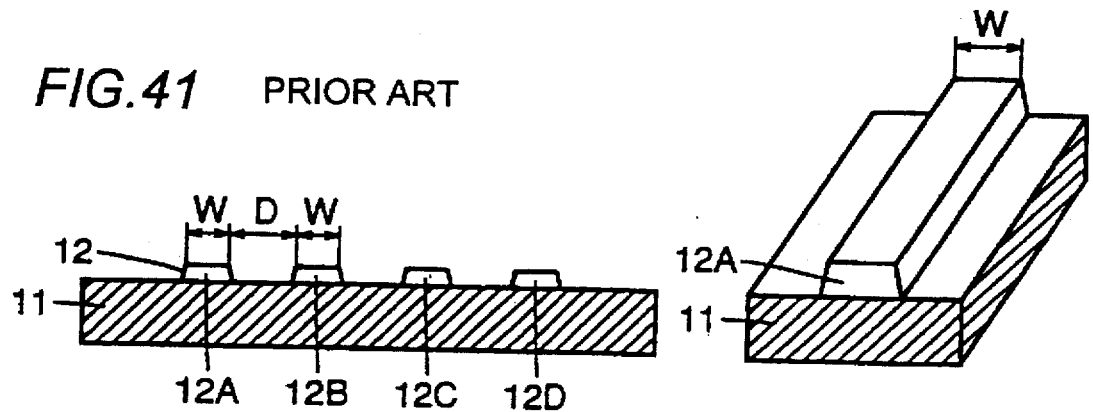
Figure 42A:
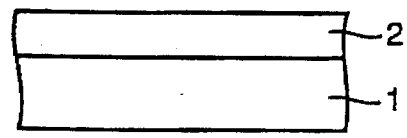
FIGS. 42A to 42F are cross sectional views showing a semiconductor device in each step in the order of a conventional method of forming fine patterns according to a second conventional example related to the present invention.
Figure 42B:
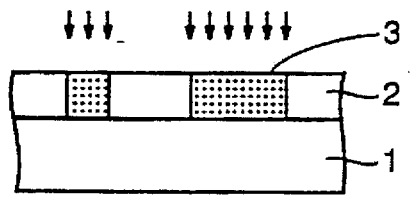
Figure 42C:
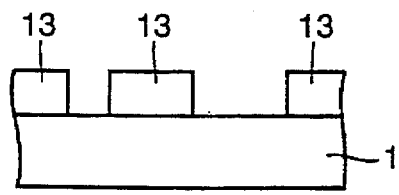
Figure 42D:
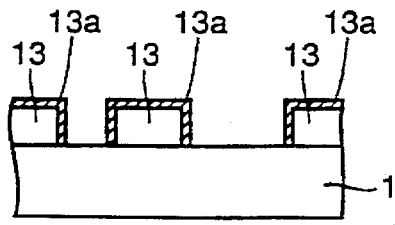
Figure 42E:
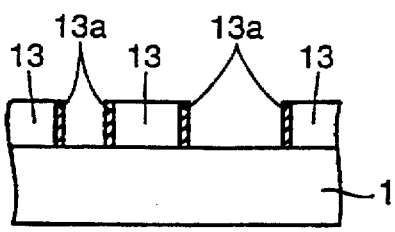
Figure 42F:
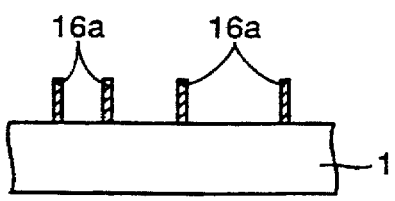

Referring to FIGS. 37B and 37C, using patterned resist 130 as mask, fine pattern 120B, part of fine pattern 120C and part of fine pattern 120D are etched away. Resist 130 is then removed away.

Referring to FIG. 37D, a fine pattern formed of fine pattern 120A, part of fine pattern 120C and part of fine pattern 120D is formed.

By the method of forming fine patterns according to the first aspect of the invention, using first and second sidewall reformed portions formed on sidewalls of patterned resist as mask, the portion of the object layer excluding the portion immediately below the first and second sidewall reformed portions are etched away, and fine patterns of the object layer are thus formed. As a result, patterns even finer than the minimum resolution achieved by the present lithography techniques are provided.

By the method of forming fine patterns according to the second aspect of the invention, using first and second sidewall reformed portions as mask, the portion of patterns of the object excluding the portion immediately below the first and second sidewall reformed portions is etched away, and therefore even finer patterns of the object can be formed. As a result, patterns finer than the minimum resolution achieved by the present lithography techniques can be advantageously provided.

By the method of forming fine patterns according to the third aspect of the invention, using patterned resist as mask, the portion of the object layer excluding the portion immediately below the patterned resist is etched away, patterns of the object are thus formed, while reforming one and the other sidewalls of the patterned resist, thus a first sidewall reformed portion is formed on the one sidewall of patterned resist and a second sidewall reformed portion on the other sidewall of patterned resist, and therefore the manufacturing process is simplified.

By the method of forming fine patterns according to the fourth aspect of the invention, using patterned resist as mask, the portion of the object layer excluding the portion immediately below the patterned resist is etched away, and thus patterns of the object are formed. Then, using the first and second sidewall reformed portions as mask, the portion of the patterns of the object excluding the portion immediately below the first and second sidewall reformed portions is etched away, and therefore even finer patterns of the object can be formed. As a result, patterns even finer than the minimum resolution achieved by the present lithography techniques can advantageously be provided.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A method of forming a fine pattern, comprising the steps of:

forming an object layer on a support member;

forming on said object layer patterned resist having opposing side surfaces;

converting a portion of said patterned resist on each opposing side surface with an agent selected from the group consisting of (a) a carbon trichloride radical, (b) a mixture of silicon ion and oxygen ion, (c) a mixture of carbon ion and carbon monoxide ion, (d) a chlorine radical, (e) aluminum trichloride liquid and (f) dibutyl magnesium liquid, leaving unconverted resist therebetween, wherein said first and second sidewalls exhibit etch characteristics different from said unconverted resist;

removing the unconverted portion of said patterned resist, thereby leaving said first and second converted sidewalls on said object layer;

etching the portion of said object layer excluding the portion immediately below said first and second converted sidewalls, using said first converted sidewall and said second converted sidewall as a mask, thereby forming a fine pattern of said object; and removing said first and said second converted sidewalls.

2. A method of forming a fine pattern as recited in claim 1, wherein (a) a carbon trichloride radical and (b) a mixture of silicon ion and oxygen ion are selected as said agents, and said one sidewall and the other sidewall of said patterned resist are converted with said (a) carbon trichloride radical, then said one sidewall and the other sidewall are once again converted with said (b) mixture of silicon ion and oxygen ion.

3. A method of forming a fine pattern as recited in claim 1, wherein (a) a carbon trichloride radical and (c) a mixture of carbon ion and carbon monoxide ion are selected as said agents, and said one sidewall and the other sidewall of said patterned resist are converted with said (a) carbon trichloride radical, and then said one sidewall and the other sidewall of said patterned resist are once again converted with said (c) mixture of carbon ion and carbon monoxide ion.

4. A method of forming a fine pattern as recited in claim 1, wherein (d) a chlorine radical and (b) a mixture of silicon ion and oxygen ion are selected as said agents, and said one sidewall and the other sidewall of said patterned resist are converted with said (d) chlorine radical, and then said one sidewall and the other sidewall of said patterned resist are once again converted with said (b) mixture of silicon ion and oxygen ion.

5. A method of forming a fine pattern as recited in claim 1, wherein (d) a chlorine radical and (c) a mixture of carbon ion and carbon monoxide ion are selected as said agents, and said one sidewall and the other sidewall of said patterned resist are converted with said (d) chlorine radical, and then said one sidewall and the other sidewall of said patterned resist are once again converted with said (c) mixture of carbon ion and carbon monoxide ion.

6. A method of forming a fine pattern as recited in claim 1, wherein (e) aluminum trichloride liquid and (b) a mixture of silicon ion and oxygen ion are selected as said agents, and said one sidewall and the other sidewall of said patterned resist are further converted with said (e) aluminum trichloride liquid, and then said one sidewall and the other sidewall of said patterned resist are once again converted with said (b) mixture of silicon ion and oxygen ion.

7. A method of forming a fine pattern as recited in claim 1, wherein (e) aluminum trichloride liquid and (c) a mixture of carbon ion and carbon monoxide ion are selected as said agents, and said one sidewall and the other sidewall of said patterned resist are converted with said (e) aluminum trichloride liquid, and then said one sidewall and the other sidewall of said patterned resist are once again converted with said (c) mixture of carbon ion and carbon monoxide ion.

8. A method of forming a fine pattern as recited in claim 1, wherein (f) dibutyl magnesium liquid and (b) a mixture of silicon ion and oxygen ion are selected as said agents, and said one sidewall and the other sidewall of said patterned resist are converted with said (f) dibutyl magnesium liquid, and then said one sidewall and the other sidewall of said patterned resist are once again converted with said (b) mixture of silicon ion and oxygen ion.

9. A method of forming a fine pattern as recited in claim 1, wherein (f) dibutyl magnesium liquid and (c) a mixture of carbon ion and carbon monoxide ion are selected as said agents, and said one sidewall and the other sidewall of said patterned resist are converted with said (f) dibutyl magnesium liquid, and then said one sidewall and the other sidewall of said patterned resist are once again converted with said (c) mixture of carbon ion and carbon monoxide ion.

* * * * *